United States Patent [19]
Tsukasaki et al.

[11] Patent Number: 5,402,564
[45] Date of Patent: Apr. 4, 1995

[54] PARTS MOUNTING SEQUENCE DETERMINATION METHOD AND APPARATUS

[75] Inventors: Hitoshi Tsukasaki, Yokohama; Keiro Yokoyama, Tokyo, both of Japan

[73] Assignee: Canon Kabushiki Kaisha, Tokyo, Japan

[21] Appl. No.: 281,503

[22] Filed: Jul. 27, 1994

Related U.S. Application Data

[63] Continuation of Ser. No. 218,449, Mar. 28, 1994, abandoned, which is a continuation of Ser. No. 910,859, Jul. 8, 1992, abandoned.

Foreign Application Priority Data

Jul. 12, 1991 [JP] Japan ............................ 3-172100
Jul. 1, 1992 [JP] Japan ............................ 4-174086

[51] Int. Cl.⁶ .................... H05K 3/30; B23P 23/00
[52] U.S. Cl. ........................ 29/832; 29/564.1; 29/739; 29/740; 29/742; 364/468
[58] Field of Search .............. 29/564.1, 739, 740, 29/741, 742, 832; 364/468

[56] References Cited

U.S. PATENT DOCUMENTS

| | | | |
|---|---|---|---|
| 4,621,406 | 11/1986 | Fujiwara et al. | |
| 4,681,452 | 7/1987 | Watanabe | |
| 4,704,792 | 11/1987 | Itagaki et al. | 29/741 |
| 4,706,187 | 11/1987 | Arai et al. | |
| 4,805,110 | 2/1989 | Takahashi et al. | |
| 4,820,114 | 4/1989 | Inaba et al. | 414/751 |
| 4,844,680 | 7/1989 | Kawata et al. | 414/331 |
| 4,932,828 | 6/1990 | Katae et al. | 414/286 |
| 4,934,278 | 6/1990 | Tanita et al. | 104/119 |
| 4,951,388 | 8/1990 | Eguchi et al. | |
| 4,951,517 | 8/1990 | Azuma et al. | 74/209 |
| 5,036,582 | 8/1991 | Usui | 29/741 X |
| 5,060,366 | 10/1991 | Asai et al. | |
| 5,165,165 | 11/1992 | Aoki et al. | 29/741 X |

FOREIGN PATENT DOCUMENTS

| | | | |
|---|---|---|---|
| 61-136298 | 6/1986 | Japan | |
| 1-89500 | 4/1989 | Japan | 29/741 |
| 1-157600 | 6/1989 | Japan | 29/741 |

*Primary Examiner*—Carl J. Arbes
*Attorney, Agent, or Firm*—Morgan & Finnegan

[57] ABSTRACT

The present invention relates to a parts mounting sequence determination method which determines mounting sequence of m parts so that each of the total m parts is sequentially mounted on a board by a turret table mounter, comprising steps of:

(a) obtaining and storing tact time, for all the parts of the m parts, for sequentially mounting two optionally selected parts among the m parts in advance;

(b) calculating the minimum tact time of all tact times on all routes including a coming step n which is consecutively processed from a step i, to each part of optional $m_i$ ($m_i < m$) parts of the m parts which are capable of being allotted in step i;

(c) allotting the first part in a series of parts which provide the minimum tact time in the $m_i$ tact times in step i calculated in step (b); and (d) repeating the steps (a) through (c) for each part after step (i+1).

12 Claims, 21 Drawing Sheets

CASSETTE-PART CORRESPONDENCE TABLE (CP)

| CASSETTE NUMBER | | | | | |
|---|---|---|---|---|---|
| PART NUMBER | | | | | |

FIG. 7

HEAD-PART CORRESPONDENCE TABLE (HP)

| HEAD NUMBER | | | | | |
|---|---|---|---|---|---|
| PART NUMBER 1 | | | | | |
| PART NUMBER 2 | | | | | |
| | | | | | |

FIG. 8

PART ARRANGEMENT TABLE (PT)

| MOUNTING POSITION NUMBER | | | | | |
|---|---|---|---|---|---|
| X | | | | | |
| Y | | | | | |
| θ | | | | | |
| PART NUMBER | | | | | |

FIG. 9

CASSETTE ARRANGEMENT TABLE (CA)

| CASSETTE POSITION | 1 | 2 | 3 | 4 | 5 | 6 | 7 |
|---|---|---|---|---|---|---|---|
| CASSETTE NUMBER | | | | | | | |
| PART NUMBER | | | | | | | |

FIG. 10

HEAD ARRANGEMENT TABLE (HA)

| HEAD POSITION | 1 | 2 | 3 | 4 |
|---|---|---|---|---|
| PART NUMBER | | | | |

FIG. 11

MOUNT SEQUENCE ORDER TABLE (MS)

| SEQUENCE | 1 | 2 | | |
|---|---|---|---|---|
| PART NUMBER | | | | |
| X | | | | |
| Y | | | | |
| θ | | | | |

FIG. 12

| j\i | S | P1 | P2 | P3 | P4 | P5 | P6 | P7 | E |
|---|---|---|---|---|---|---|---|---|---|
| S |   | 1 | 2 | 3 | 4 | * | * | * | * |
| P1 | * |   | 3 | 5 | 2 | 5 | 4 | 4 | 3 |
| P2 | * | 3 |   | 1 | 2 | 4 | 5 | 1 | 4 |
| P3 | * | 5 | 1 |   | 3 | 5 | 2 | 4 | 2 |
| P4 | * | 2 | 2 | 3 |   | 2 | 4 | 1 | 3 |
| P5 | * | 5 | 4 | 5 | 2 |   | 3 | 5 | * |
| P6 | * | 4 | 5 | 2 | 4 | 3 |   | 1 | * |
| P7 | * | 4 | 1 | 4 | 1 | 5 | 1 |   | * |
| E | * | * | * | * | * | * | * | * |   |

CASSETTE POSITION

|    | 1 | 2 | 3 | 4 | ---------- | 20 |
|----|---|---|---|---|------------|----|
| 1  |   | 1 | 2 | 3 | ---------- | 19 |
| 2  | 1 |   |   |   |            |    |
| 3  | 2 |   |   |   |            |    |
| 4  | 3 |   |   |   |            |    |
| ⋮  | ⋮ |   |   |   |            |    |
| 20 | 19|   |   |   |            |    |

FIG. 17

TURRET ROTATIONAL ANGLE

|      | 1/10 | 2/10 | ---------- | 9/10 |
|------|------|------|------------|------|
| COST |      |      |            |      |

FIG. 18

PARTS MOUNTING SEQUENCE DETERMINATION METHOD AND APPARATUS

This application is a continuation of application Ser. No. 08/218,449, filed Mar. 28, 1994, now abandoned, which is a continuation of Ser. No. 07/910,859, filed Jul. 8, 1992, now abandoned.

BACKGROUND OF THE INVENTION

The present invention relates to a method and an apparatus which determine a sequence that parts are mounted on a printed circuit board and the like by a turret table mounter having a plurality of heads. More particularly, the present invention relates to a method and an apparatus which determines the mounting sequence in a parts mounting system comprising a turret table mounter, a part feeder which feeds a part from a plurality of kinds of part cassettes to the turret table mounter, and a positioner which positions the circuit board.

The present application relates to the method and apparatus which determines the mounting sequence in the system utilizing the "mounting system" of the application U.S. Ser. No. 07/552,126 which is the co-assigned application of the present application. Therefore, the co-assigned application is incorporated into the present application by reference.

As a conventional apparatus, a turret table mounter has been used to mount small electric parts on a printed circuit board. The turret table mounter comprises a turret table having a plurality of heads which perform a rotary operation. In the mounting operation of the turret mounting apparatus, one of the heads normally picks up a part at a single fixed point (which is referred to as a "pickup position" thereafter), and the turret is rotated 180 degree, and then the head holding the part inserts the part to the printed circuit board at the position located 180 degree from the pickup position (which is referred to as an "insertion position" thereafter).

In this way, in the turret table mounter, the following operations are necessary: the head picks up a part, the head holding the part is moved to the insertion position, and the part is inserted into the printed circuit board. A head can hold only parts which fit to the shape of the head. Therefore, the head which cannot pick up the part locating at the pickup position must rotate without picking up any part. Thus, in what sequence the part is picked up or inserted considerably affects the time required for parts mounting.

The part feeder which feeds a part to the turret table mounter usually comprises a cassette moving mechanism having a plurality of part cassettes which moves the cassette with the necessary parts to the pickup position. Therefore, in what sequence the part feeder feeds parts affects the time required for adjusting a mounting position, that is, the efficiency of parts mounting.

Furthermore, on the printed circuit board, mounting positions (normally "lead holes" are provided on a mounting position) to which a plurality of parts (e.g. IC packages or tip resistors) are inserted can be set in advance. With such a setting, the positioner moves and positions the board so that each mounting position reaches the insertion position. Since the arrangement of parts to be mounted is two-dimensional on the printed circuit board, the sequence of the parts mounting considerably affects the time required for mounting.

Thus, in a mounting system utilizing a turret table mounter, the appropriate sequence for parts mounting needs to be determined because the sequence of parts mounting considerably the efficiency of mounting.

In the conventional arts, the "single-point searching method" or "whole-point searching method" is utilized as a method to determine the sequence of parts mounting.

The "single-point searching method" is a method which determines a part which is the closest to the part which has been determined in step $n-1$ as the part to be mounted in step n. The "whole-point searching method" is a method which searches all groups of the sequences on the all parts to be mounted and examines the sequence of each part of the group.

In the conventional arts, there are the following drawbacks In the "single-point searching method", as the number of parts to be mounted increases, the accuracy of resolution decreases, while in the "whole-point searching method", the time required for calculation increases and becomes beyond practical use.

Furthermore, in the conventional mounting system, there is another drawback. Normally, a single turret table mounter is required to mount parts on at least two kinds of printed circuit boards. But in the conventional method in order to determine the sequence of parts mounting, the sequence is usually determined by taking into consideration the arrangement of the part mounting head on the turret and the cassettes in the part feeder for only a Single printed circuit board. The other printed circuit board is not considered at all. Therefore, in the case where at least two kinds of printed circuit boards are to be mounted with parts, the system needs to be stopped to change the arrangement of the heads and/or change some of the heads whenever the kind of a printed circuit board is changed.

Thus, there is the drawback that the production efficiency is decreased because of the time required for adjustment in the turret portion changes in the mounter, as well as the head arrangement for head changes.

SUMMARY OF THE INVENTION

Accordingly, it is an object of the present invention to provide a method which can efficiently determine a part mounting sequence which is considerably accurate.

According to the present invention, the foregoing object is attained by providing a parts mounting sequence determination method which determines mounting sequence of m parts so that each of the total m parts is sequentially mounted on a board by a turret table mounter. The method, comprising the steps of:

(a) obtaining and storing tact time, for all the parts of the m parts, for sequentially mounting two optionally selected parts among the m parts;

(b) calculating the minimum tact time of all tact times on all routes including coming n steps which are consecutively processed from an i-th step, for each part of optional $m_i$ ($m_i < m$) parts of the m parts which are capable of being allotted in the i-th step;

(c) allotting the first part in a series of parts which provide the minimum tact time in the $m_i$ tact times for the i-th step calculated in step (b); and (d) repeating steps (a) through (c) for each step after the (i+1)-th step.

That is, in a mounting sequence determination by the mn-point searching method, in the case where which part is mounted in a certain step is determined, a mounting sequence is determined more accurately than that of the conventional one-point searching method and more efficiently that of whole-point searching method in a manner such that partial steps including n steps beyond that step is considered.

It is another object of the present invention to provide a mounting method which does not need either head arrangement or head change in the case where a mounting object.

According to the present invention, the foregoing objects are attained by providing a parts mounting sequence determination apparatus in a mounting system including:

a part feeder having a plurality of cassettes containing parts in every kind;

a turret mounter having a plurality of heads which can hold a part fed by the part feeder; and a positioner which positions a work board to mount the part fed by the mounter on the work board; said system comprising:

first data input means for inputting relations between the parts to be mounted on the work board and the part cassettes which contain those parts;

second data input means for inputting relations between the parts to be mounted on the work board and the heads capable of holding those parts;

third data input means for inputting a mounting coordinate of the parts to be mounted on the work board;

first rule storage means for storing a first rule which determines a cassette arrangement in the feeder;

cassette arrangement determination means for determining a cassette arrangement by applying the first rule to the part-cassette correspondence relation which is stored in the first storage;

second rule storage means for storing a second rule which determines a head arrangement in the mounter;

head arrangement determination means for determining a head arrangement by applying the second rule to the head correspondence data which is stored in the first storage means; and mounting sequence determination means for determining a sequence by using the cassette arrangement which has been determined by the cassette arrangement determination means, the head arrangement which has been determined by the head arrangement determination means, and the data on the parts to be mounted and the coordinates which are stored in the third storage means.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 7 is a diagram illustrating the construction of the cassette-part correspondence table CP;

FIG. 8 is a diagram illustrating the construction of the head-part correspondence table HP;

FIG. 9 is a diagram illustrating the construction of the part arrangement table PT;

FIG. 10 is a diagram illustrating the construction of the cassette arrangement table CA;

FIG. 11 is a diagram illustrating the construction of the head arrangement table HA;

FIG. 12 is a diagram illustrating the construction of the mounting sequence table MS;

FIG. 15 is a diagram for explaining the process that the table MS is generated from the table CA and table HA;

FIGS. 16, 17, and 18 are the diagrams illustrating the cost table;

PREFERRED EMBODIMENT OF THE INVENTION

Preferred embodiment of the present invention will now be described in detail in accordance with the accompanying drawings. The present system comprises the part feeder having stick cassettes accommodating a plurality of parts which feeds one parts from the cassette, the turret table mounter having the heads to hold the specific part fed by the part feeder, and the XYθ table positioner in order to shift a printed circuit board to the proper mounting position.

Figure 1:
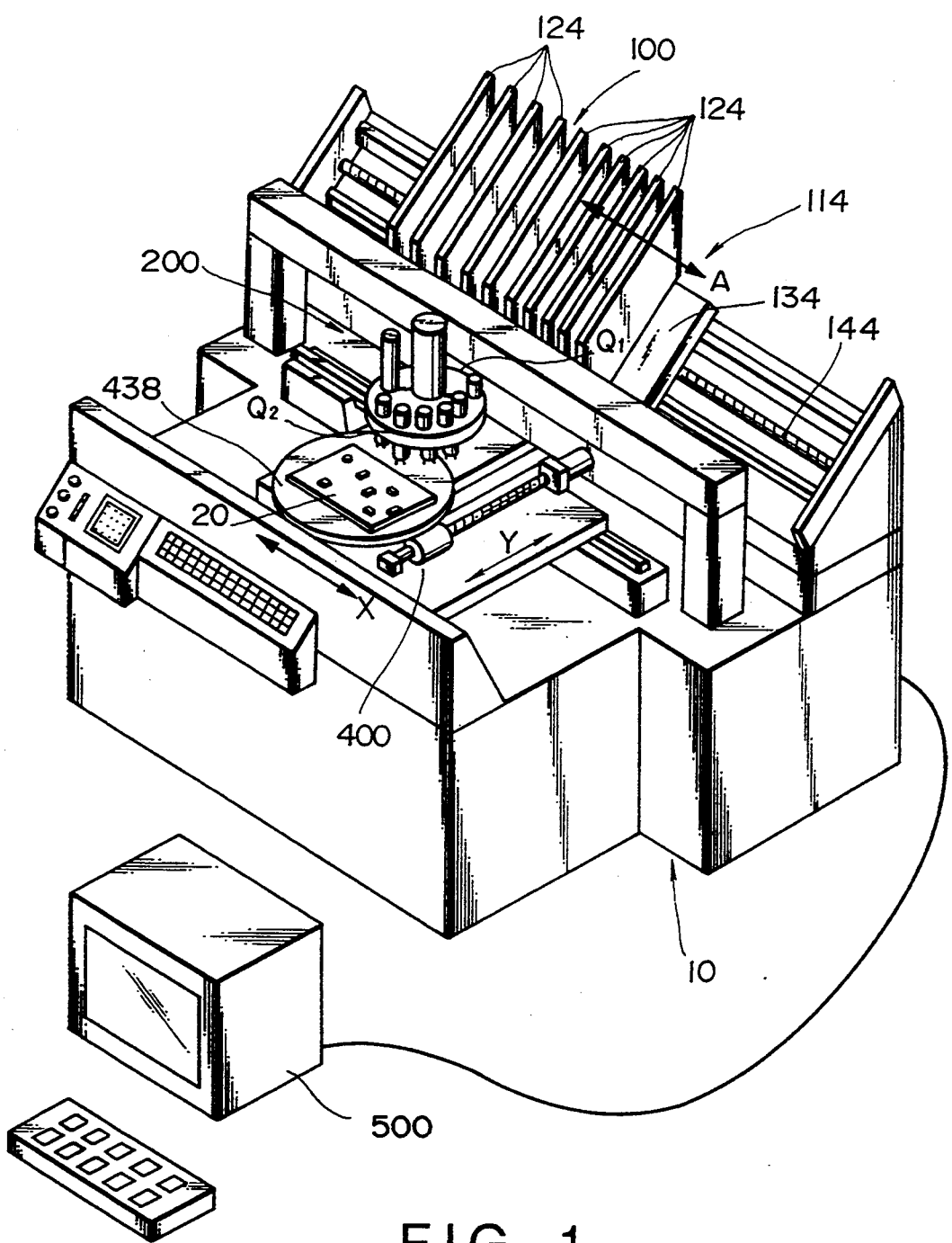
FIG. 1 is an outer view of the objective part mounting system to which the determination method of the mounting sequence according to the present invention is applied.
Figure 2:
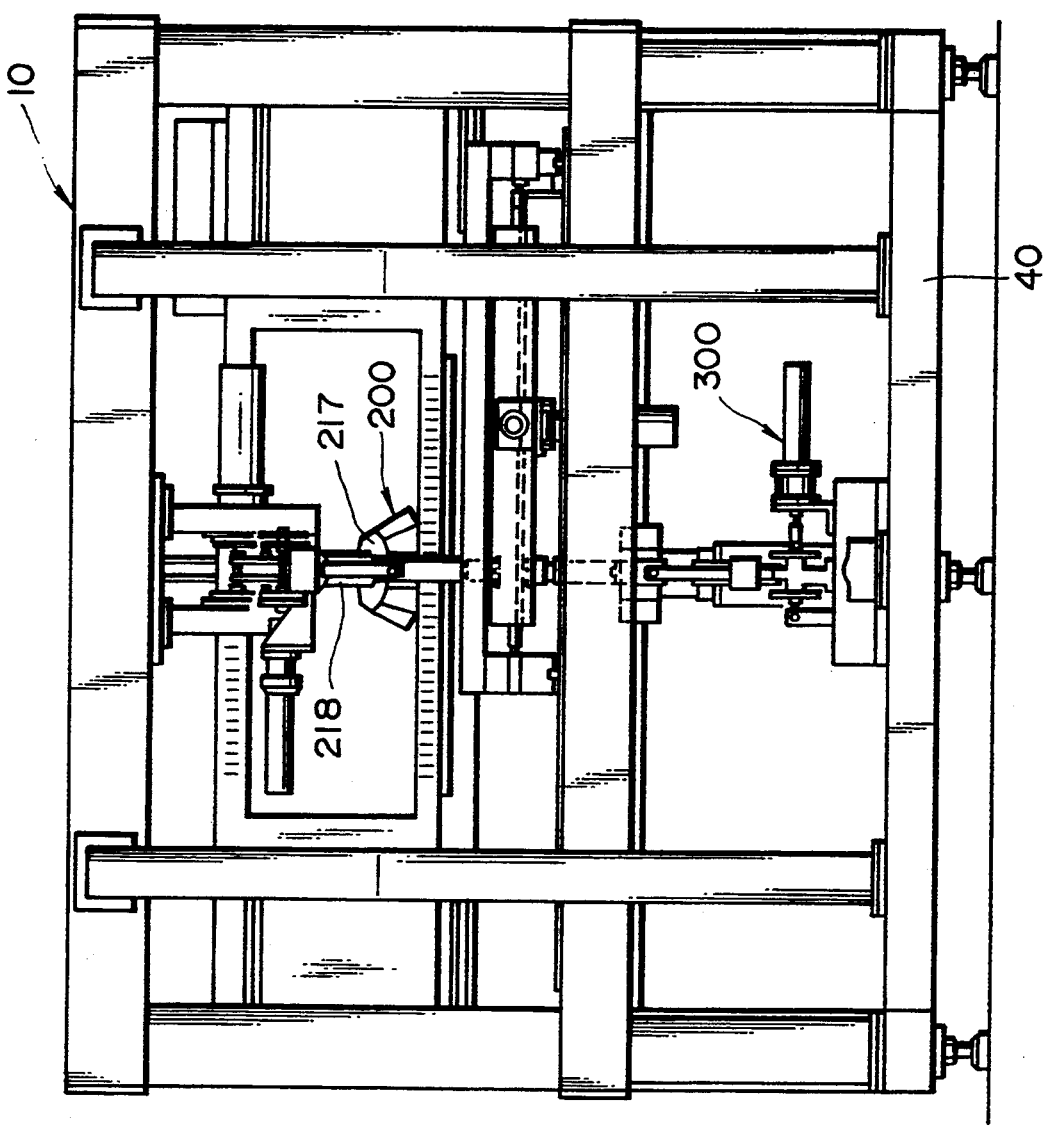
FIG. 2 is a rear view of the inside of the mounting system of FIG. 1.
Figure 3:
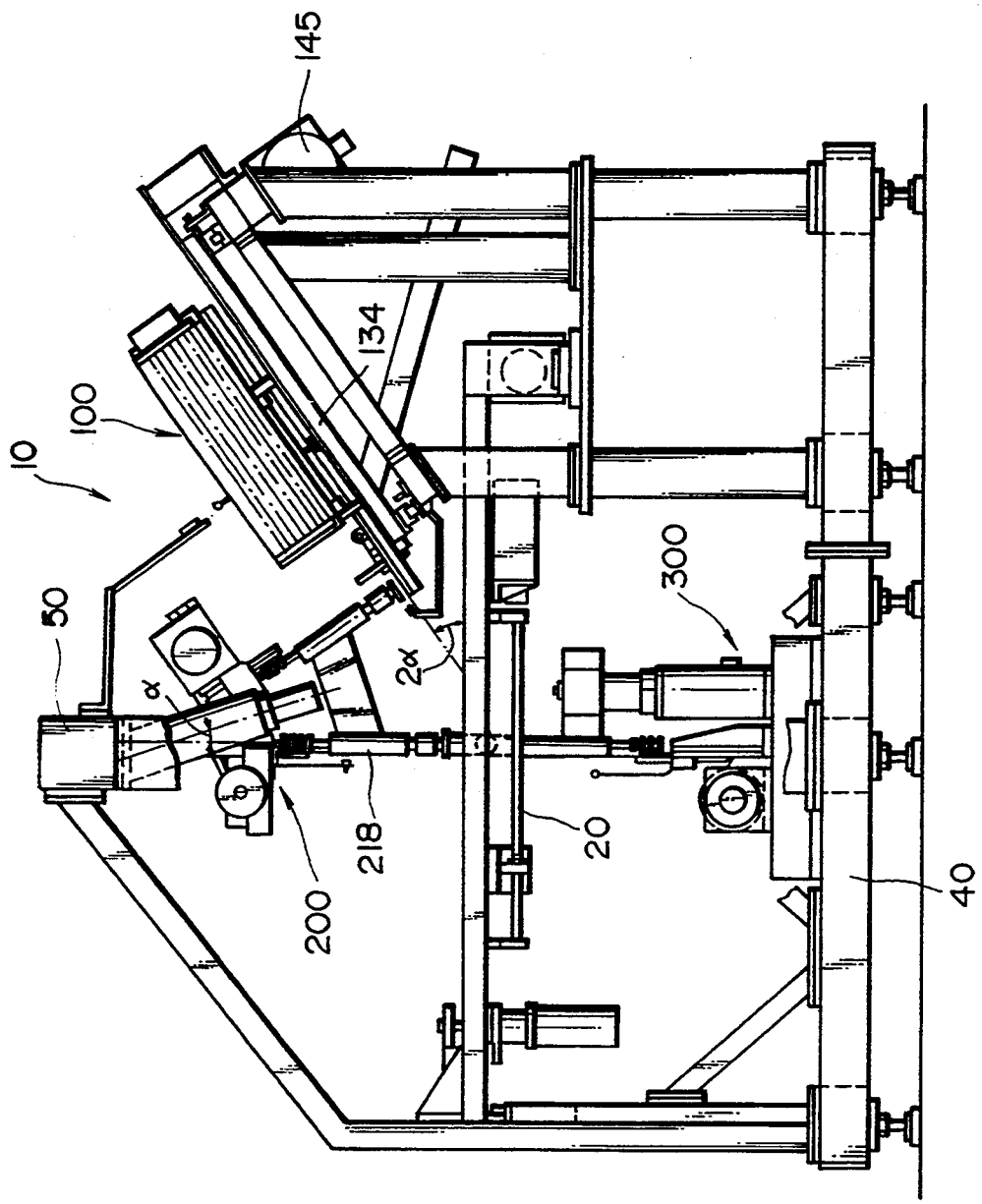
FIG. 3 is a side view of the inside of the mounting system of FIG. 1.

According to an embodiment, as shown in FIGS. 1 to 3, a mounting system 10 mainly comprises a part feeder 100 for selectively picking up and feeding one cassette among a plurality of cassettes, the turret table mounter 200 for picking up the part W fed to a pickup position, conveying the part W to an insertion position, and inserting the part W into a printed circuit board 20 at the insertion position, a clincher 300 for clinching the electronic part W inserted into the printed circuit board 20 by the turret table mounter 200, and the printed circuit board positioner 400 for linearly moving the printed circuit board 20 along the x- and y-axes to set an angular position and a rotation posture of the part W at the insertion position with respect to the printed circuit board 20 and for rotating and driving the part W about a vertical axis. The part feeder 100 is capable of accommodating cassettes of ten different shapes for different size parts to be installed and a total of twenty cassettes at one time. In this embodiment, the cassette is designed to accommodate a package type IC, for example.

Figure 4:
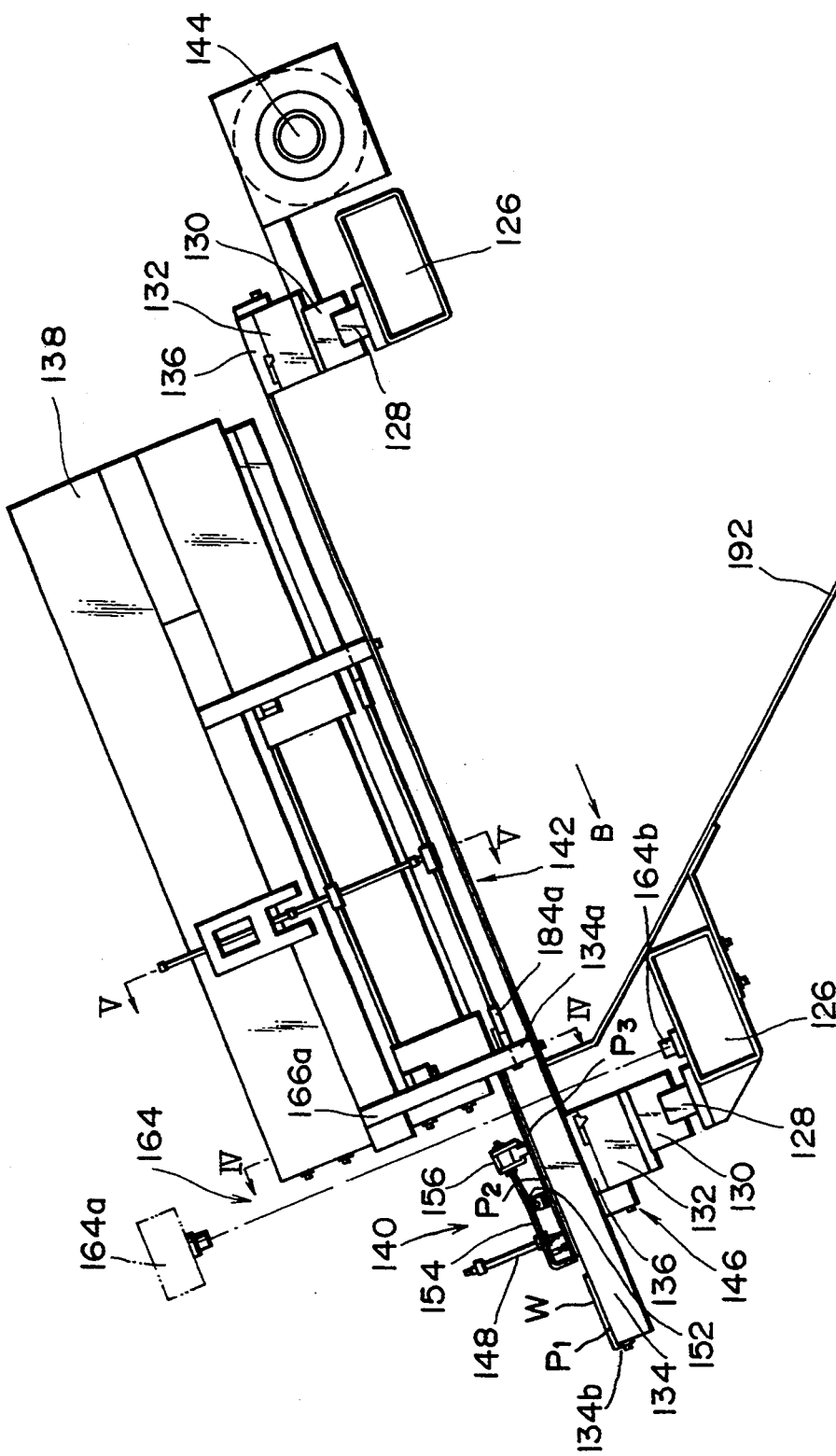
FIG. 4 is a side view of the part feeder 100.

As shown in FIG. 4, the part feeder 100 comprises a plurality of work feed units 124 aligned in directions indicated by a double-headed arrow A. Each work feed unit 124 receives the stick cassettes S which contain a predetermined number and type of parts W. The stick cassettes for a particular part W are stacked, and a part W included in the lowest cassette is fed to the table mounter 200. The part feeder 100 has a moving mechanism 114 for reciprocating each work feed unit through a pickup position $Q_1$ (refer to FIG. 1) on a line along the A direction. In the part feeder 100, a desired type of work W is selectively brought into the pickup position $Q_1$ by the moving mechanism 114. $Q_2$ denotes an insertion position.

Referring to FIG. 1, turret table mounter 200, part feeder 100, table positioner 400 are mounted on base 40. Referring to FIGS. 2 and 3, mounter 400 comprises a plurality of heads 217 (218). A head 217 denoted by 217 pick up a part fed by the part feeder 100 at the picking up position and a head denoted by 218 inserts a part into the board 20 at the insertion position. Clincher 300 clinches the pins of the inserted part on the board 20.

FIG. 4 illustrates the part feeder 100 in the mounting system 10. As shown in FIG. 4, the part feeder 100 comprises support tables 126 fixed on a base (not shown) and inclined from a horizontal plane by a predetermined angle. Each support table 126 extends in the directions of the arrow A (shown in FIG. 1). Each guide rail 128 which extends in the directions of arrow A is fixed on the corresponding support table 126. A slidable member 130 is fitted on the corresponding guide rail 128 to be slidable along the directions of the arrow A and to extend in the directions of arrow A. Reception tables 132 are formed on each slidable member 130 at predetermined intervals along the directions of the arrow A.

Each work feed unit 124 comprises a chute table 134 extending in a direction of an arrow B to be inclined at the predetermined angle, and a pair of front and rear mounting tables 136 detachably engaged on the corresponding reception tables 132.

Each work feed unit 124 accommodates a plurality of cassettes 138 located almost at the center of the chute table 134 and further comprises a work separation mechanism 140 and a empty stick cassette discharge mechanism 142. The work separation mechanism 140 separates works W one by one while each work is separated from each other after the final part is dropped from the lowermost stick cassette S in the direction of the arrow B and is dispensed on the chute table 134. The empty stick cassette discharge mechanism 142 discharges an empty stick cassette.

With the above arrangement, in each work feed unit, the mounting table 136 is detachably mounted on the reception table 132 and is detached therefrom or attached thereto independently of the support table 126 serving as a fixing portion.

An opening 134a having a size enough to receive one stick cassette S is formed in an intermediate portion of the chute table 134. The cassette 138 is mounted above the opening 134a.

The work is dropped and dispensed from the lowermost stick cassette S in each work feed cassette 138 along an inclination direction of the chute table 134, as indicated by the arrow B. The work then abuts against a stopper 134b formed at the front end portion of the chute table 134 and is stopped and kept at this position. The position where the work abuts against the stopper 134b is defined as a separation position $P_1$ of the work W.

A ball screw 144 constituting the moving mechanism 114 extends along the directions of arrow A behind the rear slidable members 130 of the pairs of front and rear slidable members 130. The rear slidable members 130 are threadably engaged with the ball screw 144. Upon rotation of the ball screw 144 by a drive motor 145 (FIG. 3), the slidable members 130 threadably engaged with the ball screw 144 (the work feed units mounted to the slidable members 130 through engagement between the reception tables 132 and the mounting tables 136) are moved along the guide rails 128 in the directions of the arrow A.

The work separation mechanism 140 is arranged on the chute table 134 at a position offset from the cassette 138 in the direction of the arrow B. The work separation mechanism 140 is actuated by an air pressure as a pneumatic actuating means and comprises a pneumatic cylinder 148 connected to a solenoid switching valve (not shown) through an air supply mechanism 146.

The pneumatic cylinder 148 comprises a piston rod (not shown) which extends downward upon supply of air from a pneumatic source (not shown) through a solenoid switching valve to the upper portion of the pneumatic cylinder 148 and which is retracted upward upon supply of the compressed air to the lower portion of the cylinder 148.

The work separation mechanism 140 comprises a swingable stay 154, the central portion of which is rotatably supported about a support shaft 152 with respect to the chute table 134 so that it can rotate in the up-down directions. The lower end of the pneumatic cylinder 148 is attached at the portion of the swingable stay 154 which extends in the direction of the arrow B on the downside of the swingable stay 154. One end of the swingable stay 154 is bent at angle 90 degrees, and contacts with the upper surface of the chute table 134 while the piston rod extends downward. A stop mechanism 156 for pressing the upper surface of the work W sliding down along the chute table 134 and locking the work is mounted at the upper end of the swingable stay 154.

As shown in FIG. 4 in detail, the stop mechanism 156 comprises a substantially cylindrical housing (not shown) having a lower open surface and fixed to the other end of the swingable stay 154, a vertically movable stop member retractable from the housing, and a coil spring (not shown) for always biasing the press member downward.

The work separation mechanism 140 is arranged as described above. When air is supplied to the pneumatic cylinder 148 and the piston rod is moved downward, the swingable stay 154 is pivoted clockwise about the support shaft 152. A lock portion defined at the bent end portion (one end) of the swingable stay 154 is brought into a position spaced apart from the upper surface of the chute table 134. As a result, the work W located at a lock position $P_2$ is released from a state locked at a lock portion and passes below the lock portion 154a. The work W is slipped down to the separation position $P_1$.

In the lock released state, the other end of the swingable stay 154 mounted with the press mechanism 156 is shifted downward to hold the work W slipped down to the standby position $P_3$ defined immediately behind the lock position $P_2$, so that the work W is kept stopped.

In this state, when air supply to the pneumatic cylinder 148 is stopped in the work separation mechanism 140, the piston rod 150 is retracted upward by a biasing force of a return spring (not shown). The swingable stay 154 is pivoted about the support shaft 152 counterclockwise. As a result, the press mechanism 156 does not press the work W located at a standby position $P_3$. Therefore, the work W located at the standby position $P_3$ is slipped down toward the lock position $P_2$.

Upon counterclockwise pivotal movement of the swingable stay 154, the lock portion (stopper) 154a is shifted downward. As a result, a locked state of the work W by the stopper 154a is achieved, and the work W slipped down from the standby position $P_3$ is locked at the lock position $P_2$.

Since the work W is slipped down from the standby position $P_3$ to the stopper $P_2$, the next work W located at a work feed position is slipped down from the stick cassette S by its weight and abuts against the trailing end of the work W located at the stopper $P_2$, so that this next work is held at the standby position $P_3$.

In this manner, only one work W is separated at the separation position $P_1$.

In this manner, a series of separation operations are performed to complete feed of the next work W to the separation position $P_1$.

In each work feed unit, the part feeder 100 is moved in a direction indicated by the arrow A by the moving mechanism 114 while only one work W is separated and held at the separation position $P_1$. In the work feed unit which stores works W having a desired type, the work W held at the separation position $P_1$ is brought into a pickup position $Q_1$.

As shown in FIG. 4, a detection mechanism 164 is arranged to detect whether the work W is located at the standby position $P_3$ so as to just vertically cross the rear portion of the work W located at the standby position $P_3$. This detection mechanism 164 comprises a photocoupler which comprises a light-emitting element 164a located at an upper position and a light-receiving element 164b located below the light-emitting element to receive light from the light-emitting element 164a. That is, in a state wherein the light-receiving element 164b can receive light from the light-emitting element 164a, the detection mechanism 164 detects that the work W is not located at the standby position $P_3$. In a state wherein light cannot be received from the light-emitting element 164a, the detecting mechanism 164 detects that the work W is present at the standby position $P_3$.

Figure 5:
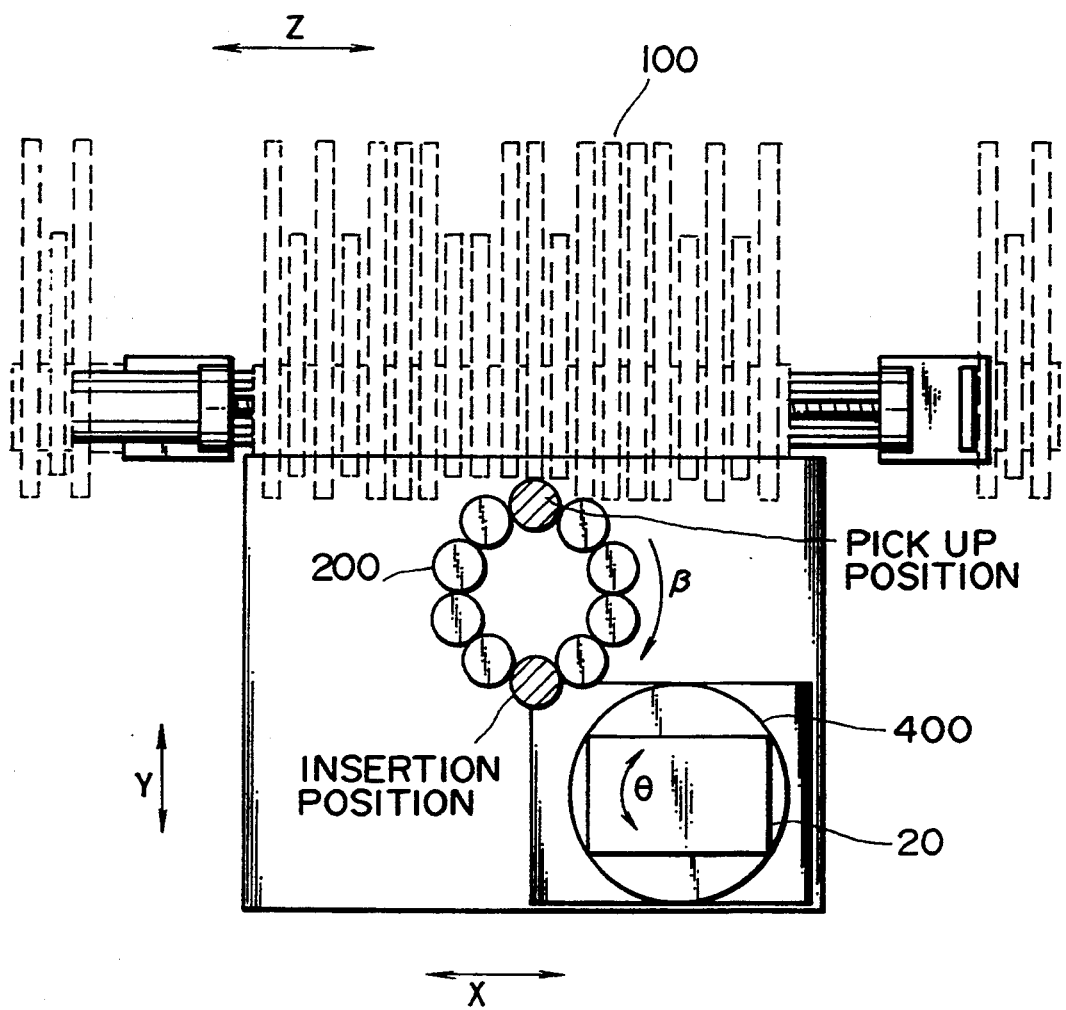
FIG. 5 is a diagram explaining the moving direction of the part feeder, turret table mounter, and XYθ table positioner in the mounter of FIG. 1.

FIG. 5 illustrates the relation between the stick cassette moving direction Z of the part feeder 100 to the head of the turret table mounter 200 and the positioning directions X, Y, and $\theta$ by the positioner 400. In the drawing, the position where the part feeder 100 passes the work to the turret table mounter 200, which is a "pickup position", is fixed. Therefore, the part feeder 100 moves the stick cassette containing the required work according to the instruction from the controller 21. In the turret table mounter 200, the ten heads are rotated to the direction $\beta$ in FIG. 5. The head which is positioned in the pickup position holds the work if that head has been instructed to do so by the controller 500.

As shown in FIG. 5, in the turret table mounter 200, the insertion position where the work held by the head is mounted on the circuit board 20 is also fixed. While the positioner 400 moves the board 20 to the x-, the y-, and the $\theta$-directions, it is adjusted such that the through hole position of the work (e.g. IC tip) to be mounted on the board 20 is placed underneath the insertion position.

Furthermore, the detail of the above-described mounting system is disclosed in the U.S. Ser. No. 07/552,126 (in which the application date is Jul. 13, 1990).

<Outline of the Parts Mounting Sequence Determination>

Referring to the mounting system of FIG. 1, how an efficient mounting sequence can be determined is roughly explained as follows. The "mounting sequence" here is defined as the sequence that the turret table mounter 200 mounts the parts on the board 20.

Figure 6:
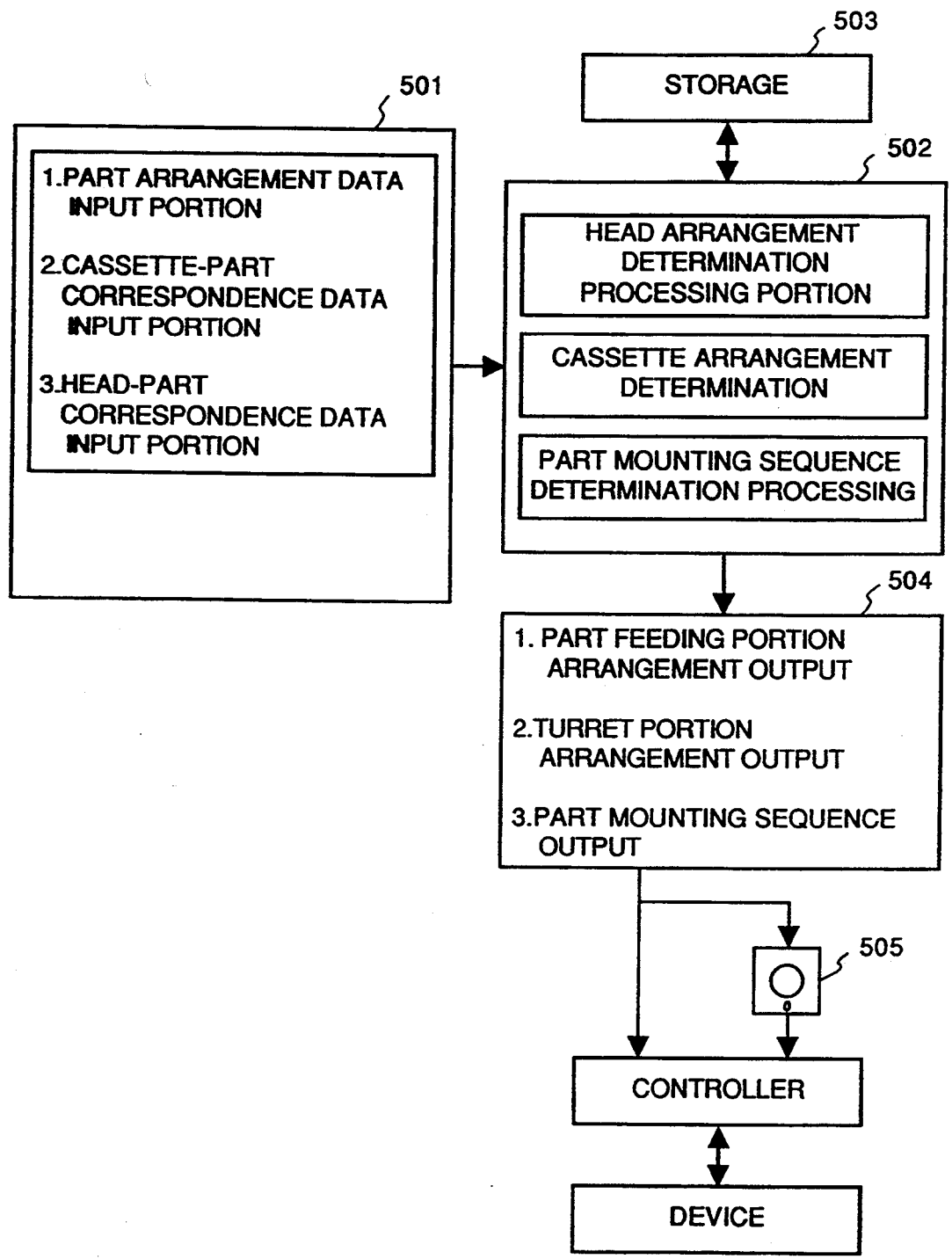
FIG. 6 is a diagram illustrating the software construction in the mounting sequence determination method according to the present embodiment.

FIG. 6 is a diagram illustrating the data flow in the controller 500 which determines the mounting sequence in the system of FIG. 1. The controller 500 mainly comprises an input portion 501, operation portion 502, storage portion 503, and output portion 504.

An operator inputs, to the input portion 501, the data on the arrangement of the parts to be mounted on the printed board (the part arrangement table PT), the data indicating the correspondence of the part and the cassette number containing that part (the cassette-part correspondence table CP), and the data indicating the correspondence of each head which is accommodated by the turret table mounter 200 and the part to be held by the head (the head-part correspondence table HP). The input portion 501 is a switch, a keyboard, or the like of the controller 500. The above-described data is stored in the storage 502 of the controller 500.

The operation portion 502 of the controller 500 determines the head arrangement table (the table HA of FIG. 11), the cassette arrangement table (the table CA of FIG. 10), and the mounting sequence order table (the table MS of FIG. 12). The determination is based on respective data set in the input portion 501. The head arrangement table comprises the head number which is given to the head position in each turret portion, and the part number which specifies the part capable of being held by the head having that head number. The cassette arrangement table indicates the correspondence of each cassette position (Z) in the part feeder 100 and the cassette number. The sequence table indicates the mounting sequence of the turret table mounter 200.

Figure 13:
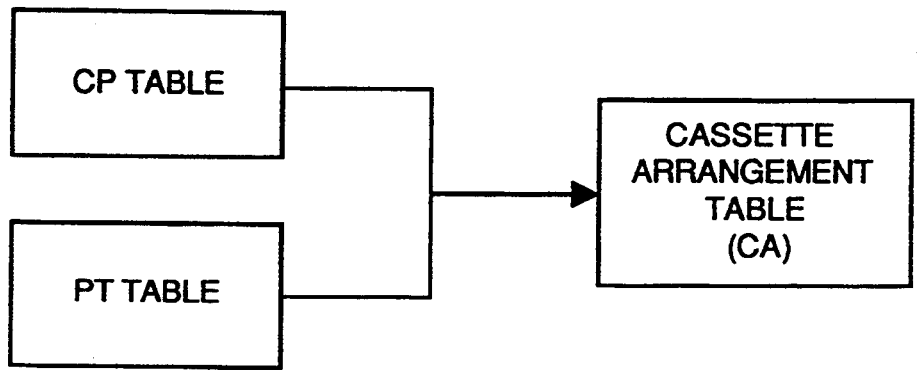
FIG. 13 is a diagram for explaining the process that the CA table is generated from the table CP and table PT.
Figure 14:
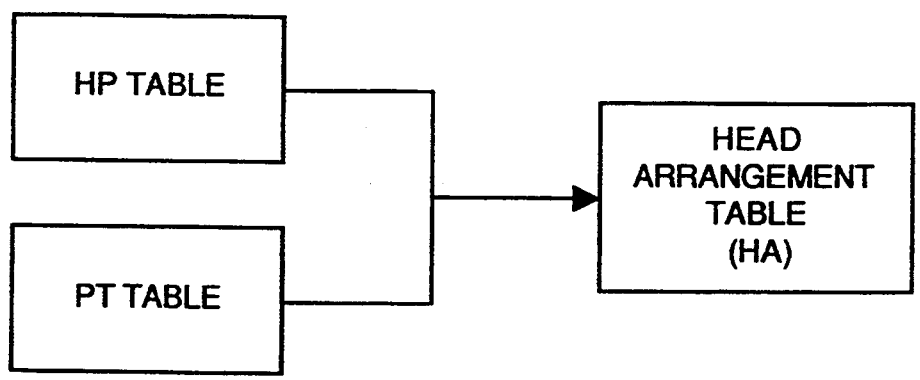
FIG. 14 is a diagram for explaining the process that the HA table is generated from the table HP and table PT.
Figures 15, 16:
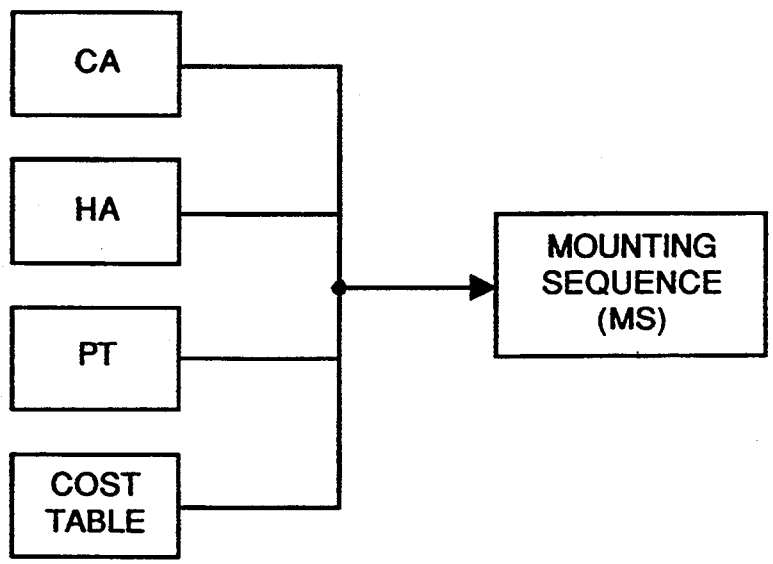

FIG. 13 illustrates that the table CA is determined from the table CP and table PT. FIG. 14 illustrates that the HA table is determined from the HP table and PT table. FIG. 15 illustrates that the MS table (FIG. 12) is determined based on the tables PT, CA, and HA, and a cost table (FIGS. 16–18).

In the output portion 504, the arrangements of heads and cassettes and the mounting sequence which are processed and determined in the operation portion 503 are displayed on the display and the like. The result is passed to the system controller by a communication or floppy disc.

Cassette-Part Correspondence Table CP

FIG. 7 illustrates the construction of the cassette-part correspondence table CP. The table CP indicates the correspondence of cassette numbers (which specifies the cassette) and part numbers which are contained in the cassette. The part feeder 100 can contain a plurality of cassettes, however, which cassette is placed on which position can be determined when the cassette arrangement table CA is determined.

Head-Part Correspondence Table HP

FIG. 8 illustrates the construction of the head-part correspondence table HP. As described above, the head-part correspondence table comprises head numbers and the list of part numbers in which the parts can be held by the heads. If a plurality of part numbers are listed in the part number field, it means that the head can hold the plurality kinds of parts.

As shown in FIG. 5, each head position is fixedly numbered as #1 to #10 to specify the head position. Any head (head number) can be set in each head position. Which head is held in which position is determined by the head arrangement table HA. Once the table HA is determined, the part which can be held by that head is naturally determined.

Part Arrangement Table PT

The part arrangement table PT in FIG. 9 covers the information on all parts to be mounted on a circuit board. The part to be mounted on a certain mounting position (which is specified by the number) is specified by the part number. The table PT further includes coordinate values on the x- and y-axes and the rotating angle $\theta$ in the board coordinate system which are referred to as the amount to be shifted by the XY$\theta$ table for the parts to be mounted.

Cassette Arrangement Table CA

FIG. 10 illustrates the construction of the table CA. The cassette position Z is numbered as 1, 2, . . . and m from the left to the right corresponding to the cassette position in the part feeder 100 of FIG. 1. When the arrangement of the cassettes in the part feeder 100 is determined, the cassette number SN, which is placed at position Z and the part number PN of the part which is contained in that cassette are written in the table to its position, Z.

Head Arrangement Table HA

FIG. 11 illustrates the construction of the table HA. The head part table HP lists the candidates of the parts to be held by each head on the turret table. The table HA specifies the head position H and the part number PN (which can be a plurality of parts) capable of being held by that head.

Mounting Sequence Order Table MS

FIG. 12 illustrates the mounting sequence table MS expressing which part is mounted at which sequence. That is, this table includes the part number PN of the part to be mounted to the number expressing the mounting sequence and the shift data on X, Y, and $\theta$ of the board 20 for the XY$\theta$ table positioner 400 to move the part mounting position to underneath the insertion position of the turret table mounter 200.

<Controlling Process>

Figure 19:
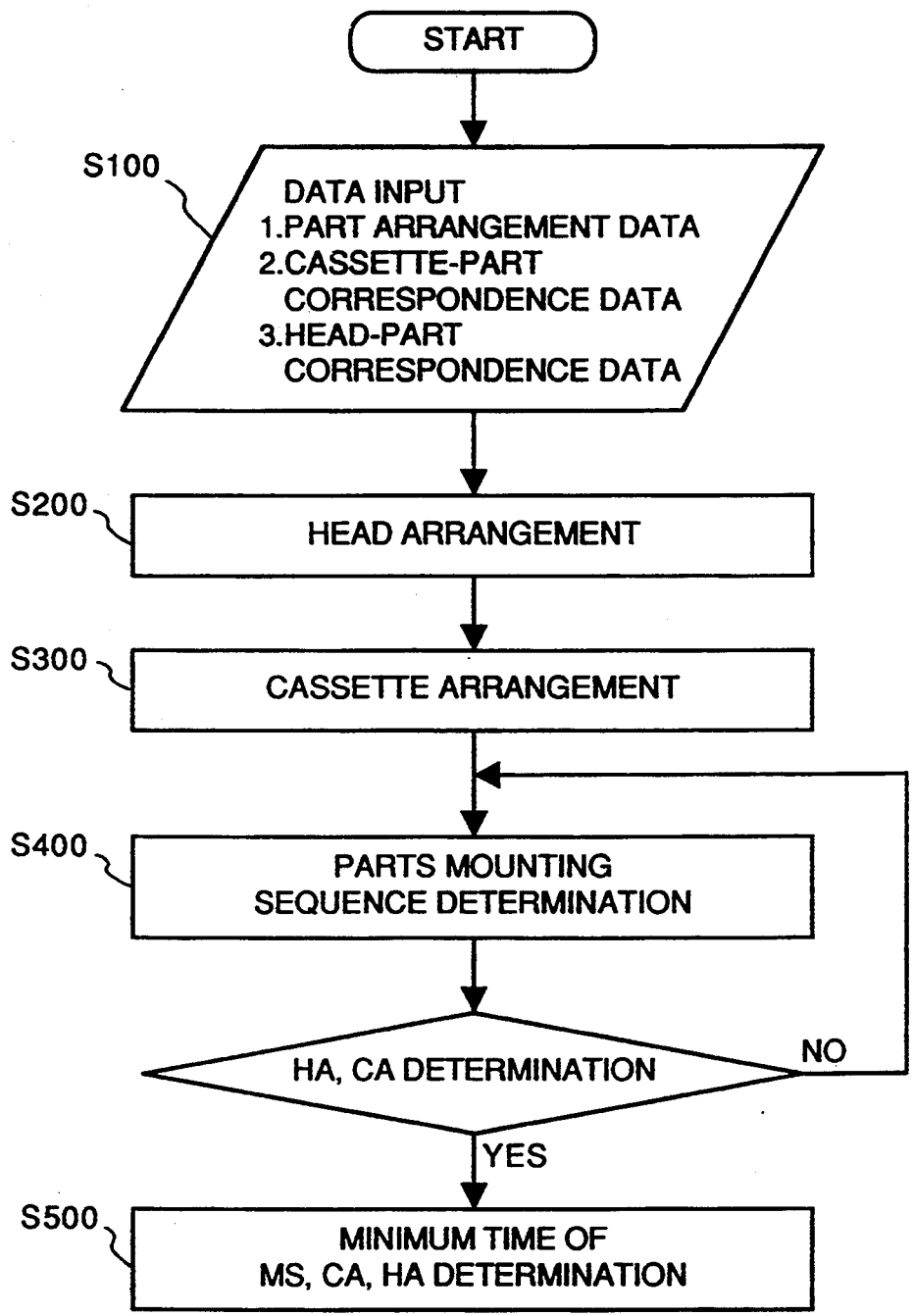
FIG. 19 is a flowchart indicating the controlling process to determine the parts mounting sequence.

FIG. 19 is a flowchart indicating the controlling process to determine the parts mounting sequence in the present system.

In step S100, the part arrangement table data PT of the printed board 20 on which the parts are mounted, the cassette-part correspondence table data CP, and the head-part correspondence table data HP are inputted from the input portion 501.

Figure 20:
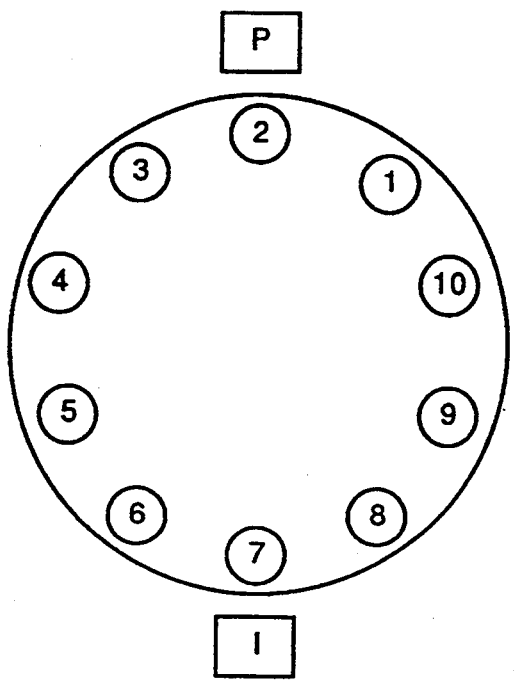
FIG. 20 is a diagram for explaining the positional relation of the head position, pickup position, and insertion position.

In step S200, a plurality kinds of head arrangement table HA are set based on the table PT and table HP which are given in step S100. As shown in FIG. 1, the turret table mounter 200 according to the present embodiment have ten head positions and each head position is numbered as 1, 2, 3, . . . , 10 to the counterclockwise direction. As shown in FIG. 20, the feeder 100 passes the part to the turret table mounter 200 at the position P (referred to as a "pickup position"). The turret table mounter 200 inserts the part to the board 20 at the position I (referred to as an "insertion position") in FIG. 20. The pickup position and the insertion position are 180 degree apart from each other. In other words, in the example of FIG. 20, when the head #7 holding a part is inserting the part at the insertion position, the head #2 can pick up the other part which has been fed by the feeder 100 at the pickup position. Therefore, the practical head arrangement enables the part insertion at the insertion position and the part pickup at the pickup position at the same time. In step S200, the reason why a plurality kinds of the table HA are set is that there are three setting rules of the table HA for the present embodiment. The possible head arrangement determination rules are as follows:

H-1:

The mount numbers of all the parts to be mounted are examined. Two kinds of parts the mount number of which are the same are respectively allotted to heads which are at opposite position, namely at 180 degree apart from each other.

The number of the parts to be mounted can be found in the table PT. According to the rule H-1, for example, in the case where each three of the parts PN=100 and PN=200 need to be mounted on the board (that is, the number of the parts to be mounted is same for the part PN=100 and PN=200), it can be set so that, if one of the parts PN=100 is held by the head #1, the part PN=200 is held by the head #6. Thus, when either head #1 or head #6 is at the insertion position, the opposite head is always picking up a part, always making full use of both possible head positions for insertion and pick-up.

Suppose that this rule is not followed, and for example, five parts of PN=100 and three parts of PN=200 are necessary. In this case, if it is set that the head #1 holds the part PN=100 and the head #6 holds the part PN=200, the head #6 uselessly stops at the pickup position twice without picking up any part when the head #1 (holding the part PN=100) stops at the insertion position. The role of the rule H-1 is to eliminate this useless operation.

H-2:

The numbers of all the parts to be mounted are examined. For this rule after the examination, the number of pieces required per part in one board operation, if, for two different parts, the number of pieces per board differs by only one, the two parts are respectively allotted to opposite heads which are 180 degree apart from each other.

For example, suppose a case where three PN=100 and two PN=200 are to be mounted on one board. If the part PN=100 is allotted to the head #1, the part PN=200 should be allotted to the head #6 which faces to the head #1 (which is 180 degree apart from the head #1). This limits the number of incompletely used stops of the head (for insertion and pick-up) to one.

H-3:

For this rule, after checking the number of pieces required for one board operation, the parts are arranged in decreasing order, then paired starting from the most parts to be mounted, e.g. most, 2nd most, 3rd most, 4th most etc. Then pairs are respectively allotted to opposite head positions which are 180 degree apart from each other. When the number to be mounted is large it is allotted to an opposite head to the head holding the kind of parts in which the number to be mounted is the second largest. This rule minimizes the number of incomplete stops of the head, i.e. insertion with no pick-up of a part on the opposite head.

For example, suppose that five parts of PN=100, four parts of PN=200, two parts of PN=300, one part of PN=400 are necessary. If the part PN=100 is allotted to the head #1, the part PN=200 is allotted to the head #6 which faces to the head #1. Then, the part PN=300 is allotted to the head #2 which is next to the head #1 and the part PN=400 is allotted to the head #7 which faces to the head #2.

In this way, as described in FIG. 14, in step S200, the three kinds of head arrangement table HA are obtained by the given part arrangement data and head-part correspondence data.

Figure 21:
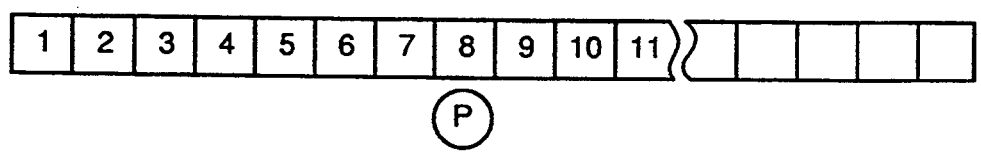
FIG. 21 is a diagram for explaining the relation between the cassette position and the pickup position.

In step S300, the cassette arrangement table CA is generated from the cassette-part correspondence table CP and the part arrangement table PT. As shown in FIG. 21, the feeder 100 has the cassettes positions which are numbered as 1, 2, 3, ... from the left to the right. The feeder 100 stays at the current position as long as the cassette shift is instructed by the controller 500. That is, if the controller 500 instructs as the cassette addresses 5→3→2 ..., the cassettes located at the addresses 5, 3, 2, ... are sequentially moved to the aforementioned pickup position.

In the present system, there are three rules prepared for the cassette arrangement, namely, determining which cassette is placed at which address position. These rules are as follows C-1~C-3.

C-1:

For this rule, after checking the number of pieces required per part for one board operation, the cassette which supplies the parts with the most pieces are assigned an address position such that the address number is smaller.

For example, suppose that two parts of PN=100, four parts of PN=200, five parts of PN=300, and one part of PN=400 are necessary in the parts mounting operation. In this case, the cassette containing the parts PN=300 is allotted to the address 1, the cassette containing the parts PN=200 is allotted to the address 2, and the cassette containing the parts PN=100 is allotted to the address 3, and the cassette containing the part PN=400 is allotted to the address 4. According to this rule, there is an advantage that the reciprocating movement of the cassettes from right to left can be reduced.

C-2:

For this rule, after checking the number of pieces required per part for one board operation, the cassettes are arranged such that the cassette containing the most pieces is assigned to the center position and the rest of cassettes in descending order are alternately allotted to the left and the right side of the center.

For example, suppose that two of PN=100, four of PN=200, five of PN=300, and one of PN=400 are necessary. If the total number of the cassette positions is 19, the address "10" is the center of the cassette arrangement. Then, the cassette containing the most pieces PN=300 is allotted to the address "10", the cassette containing the part PN=200 is allotted to the address "9", the cassette containing PN=100 to the address "11", and the cassette containing PN=400 is to the address "8".

C-3:

For this rule, after checking the number of pieces required per part for one board operation, the cassettes are arranged from left to right in every other address position in descending order according to the number of pieces per cassette.

For convenience' sake, the example that the feeder 100 has only six cassettes such as 1 to 6 is described. For example, in the parts mounting, suppose that two of the part PN=100, four of the part PN=200, five of the part PN=300, one of the part PN=400, six of the part PN=500, three of the part PN=600, and one of the PN=700 are necessary. In this case, according to the rule C-3, the cassette containing the parts PN=500 is allotted to the address "1 ", the cassette containing the parts PN=300 is to the address "3", the cassette containing the parts PN=200 is to the address "5", the cassette containing the parts PN=600 is to the address "6", the cassette containing the parts PN=100 is to the address "4", and the cassette containing the parts PN=700 is to the address "2" In comparison with the rule C-1, when the number of part is large, the rule C-3 can form a cassette arrangement such that the reciprocating movement between the left and the right is reduced.

Thus, in step S300, the three kinds of the cassette arrangement table CA are generated.

Figure 22:
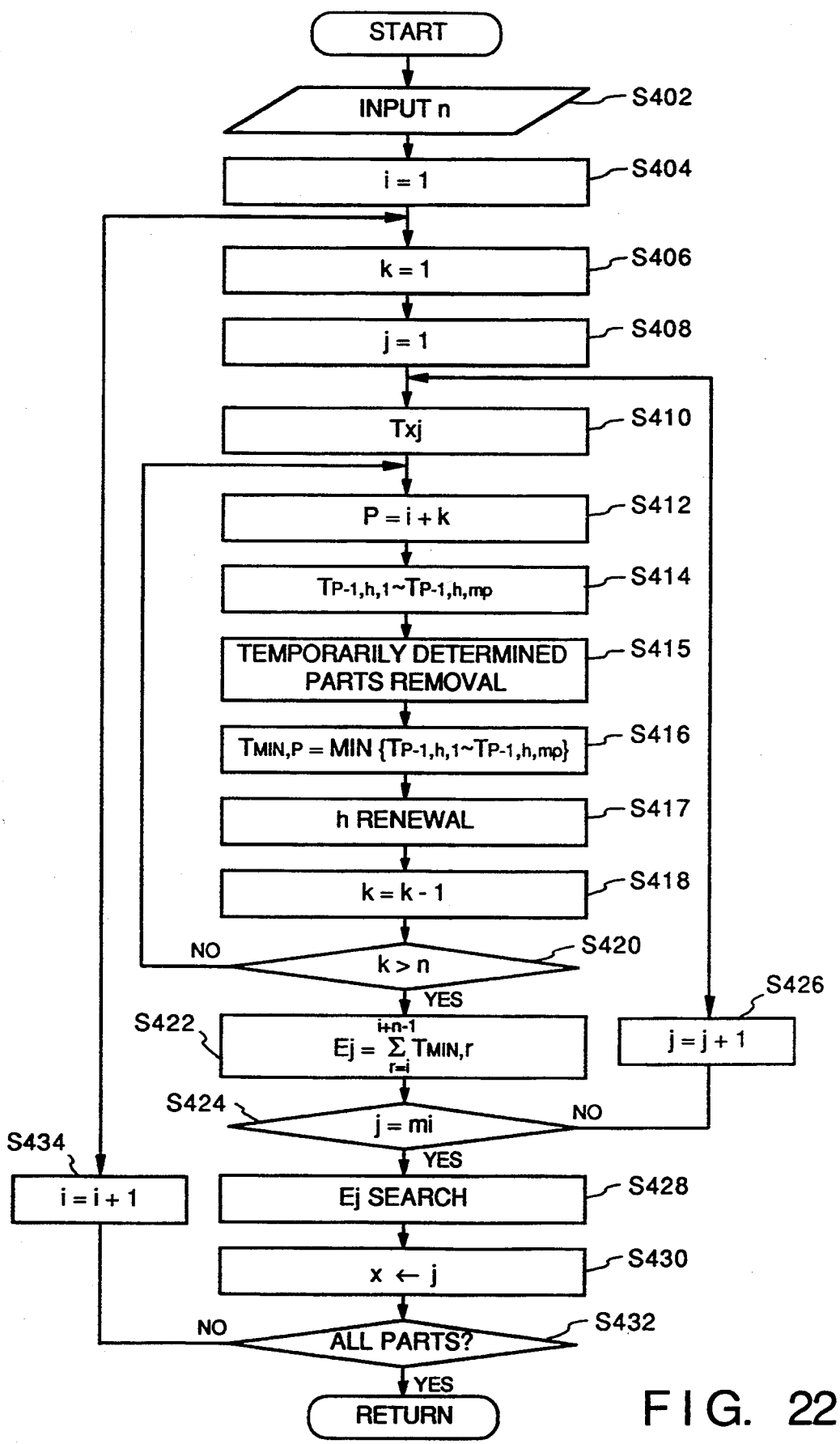
FIG. 22 is a flowchart indicating the controlling process to determine the parts mounting sequence.

In step S400, one of the tables HA generated in step S200 and one of the tables CA generated in step S300 are taken out and the mounting sequence which can realize the minimum tact time is searched. FIG. 22 illustrates the detailed controlling process in step S400.

Mounting Cost

In the mounting sequence on the board 20, the mounting sequence which provides the minimum mounting time should be best. The tact time $T_{ij}$ required for inserting the part $P_i$ into the mounting position i and further inserting the next part $P_j$ into the mounting position j is the maximum time among $t_{xy}$, $t_\theta$, $t_H$, and $t_z$.

$t_{xy}$: The time required for the board 20 to be moved from the mounting position i which is located underneath the insertion position I to the mounting position j by the $xy\theta$ table positioner 400.

$t_\theta$: The time required for the $\theta$ table to be moved from the angle $\theta_i$ of the mounting position i to the angle $\theta_j$ of the mounting position j.

$t_H$: The time required for the turret table mounter 200 to be rotated until the position $H_j$ of the head, holding the part $P_j$, is rotated to the insertion position from the point that the position $H_i$ of the head holding the part $P_i$ is located at the insertion position.

$t_z$: The time required for the feeder 100 to move the cassettes from at the time when the cassette containing the part $[P_i]$ is at cassette position $Z_i$ until the time when the cassette at position $Z_j$ containing the part $[P_j]$ reaches the pick-up position. The part [P$_j$] is defined as a part which is to be picked up by the head facing to the head holding part P$_j$. The part [P$_i$] is defined as a part which is to be picked up by the head facing to the head holding the part P$_i$. Bracket [ ] denotes a part at an opposing position.

That is, T$_{ij}$ is obtained by the following formula:

$$T_{ij} = \text{MAX}(t_{xy}, t_\theta, t_H, t_z)$$

The most important point here is that $t_{xy}$, $t_\theta$, $t_H$, $t_z$ can be calculated in advance. For example, suppose that the mounting position of the part P$_i$ is (X$_i$, Y$_i$, θ$_i$), the mounting position of the part P$_j$ is (X$_j$, Y$_j$, θ$_j$), the average velocity of the parallel movement is V$_{xy}$, the average rotational angular velocity in the direction θ of the table positioner 400 is ω$_T$, the rotational velocity of the turret table is ω$_H$, the average moving velocity of the feeder 100 is V$_z$, and the distance between a cassette and the next cassette is 1. Then, if the head number of the head holding the part P$_i$ is H$_i$ and the head number of the head holding the part P$_j$ is H$_j$, the rotational angle from the head H$_i$ to H$_j$ is 36×(H$_i$−H$_j$). Furthermore, if the position of the cassette containing the part [P$_i$] is set as Z$_i$ and the position of the cassette containing the part [P$_j$] is set as Z$_j$, the cassette shifting distance is 1×|Z$_i$−Z$_j$|. Therefore, $t_{xy}$, $t_\theta$, $t_H$, and $t_z$ are expressed as following:

$$t_{xy} = \frac{\{(X_i - X_j)^2 + (Y_i - Y_j)^2\}^{\frac{1}{2}}}{V_{xy}}$$

$$t_\theta = \frac{\theta_i - \theta_j}{\omega_T}$$

$$t_H = \frac{36 \times (H_i - H_j)}{\omega_H}$$

$$t_z = \frac{1 \times (Z_i - Z_j)}{V_z}$$

In other words, if the cassette arrangement table CA, the head arrangement table HA, and the part arrangement table PT are determined, it is easy to calculate $t_{xy}$, $t_\theta$, $t_H$, and $t_z$ based on those tables.

When the tact time T$_{ij}$ is calculated, the value of T$_{ij}$ considerably differs according to the mounting order, that is, which part is selected as the part P$_j$ to be mounted after the part P$_i$. The controlling process of FIG. 22 is that, if the part P$_i$ is determined, the part P$_j$ which provides the minimum mounting time T$_{MIN}$ is selected among the candidate parts j$_1$, j$_2$, j$_3$, ... which can be mounted after the part P$_i$.

That is, T$_{MIN}$, or minimum tact time is expressed as following:

$$T_{MIN} = \text{MIN}(T_{i,j1}, T_{i,j2}, T_{i,j3} \ldots )$$

The mn-point searching method is now described along with FIG. 22.

Outline of the Mn-Point Searching Method

The mounting sequence is determined in the present mounting system as the mounting sequence that can perform parts mounting in the minimum tact time. This method is referred to as the "mn-point searching method" hereafter. The "m" represents the number of parts to be searched and the "n" represents the number of searches to be performed for minimum tact time. "n" may be referred to as searching depth. As the value of "n" increases, the accuracy of the solution improves.

Now, the cost matrix (FIGS. 16–18) is described. FIG. 16 illustrates the moving cost of the XYv table positioner 400, FIG. 17 illustrates the cassette moving cost, and FIG. 18 illustrates the turret rotation cost.

FIG. 16 is a diagram that, in the case where the seven parts P$_1$~P$_7$ are mounted on the circuit board, the tact times $t_{xy}$, $t_\theta$, $t_H$, and $t_z$ are calculated on those parts and T$_{ij}$(i=1~7, j=1~7) is indexed (quantized) to a value in the range of "1"~"5". In FIG. 16, S represents "start", E represents "End", and the notation * means that such combination is not present. Therefore, the process should not go from none of the parts P$_1$~P$_7$ to S (start), while the process never proceeds from E (end) to any of the parts P$_1$~P$_7$. Since the head in which the total number of the parts to be mounted is the largest is used in the first step, the mounting sequence should start from none of the P$_5$~P$_7$. Furthermore, since the last step should process one of the parts P$_1$~P$_4$, the mounting sequence never ends with one of the parts P$_5$~P$_7$. If the process proceeds from the part P$_2$ to the part P$_6$, the index value is "5". If the process proceeds from the part P$_5$ to the part P$_4$, the index value is "2".

Figure 24:
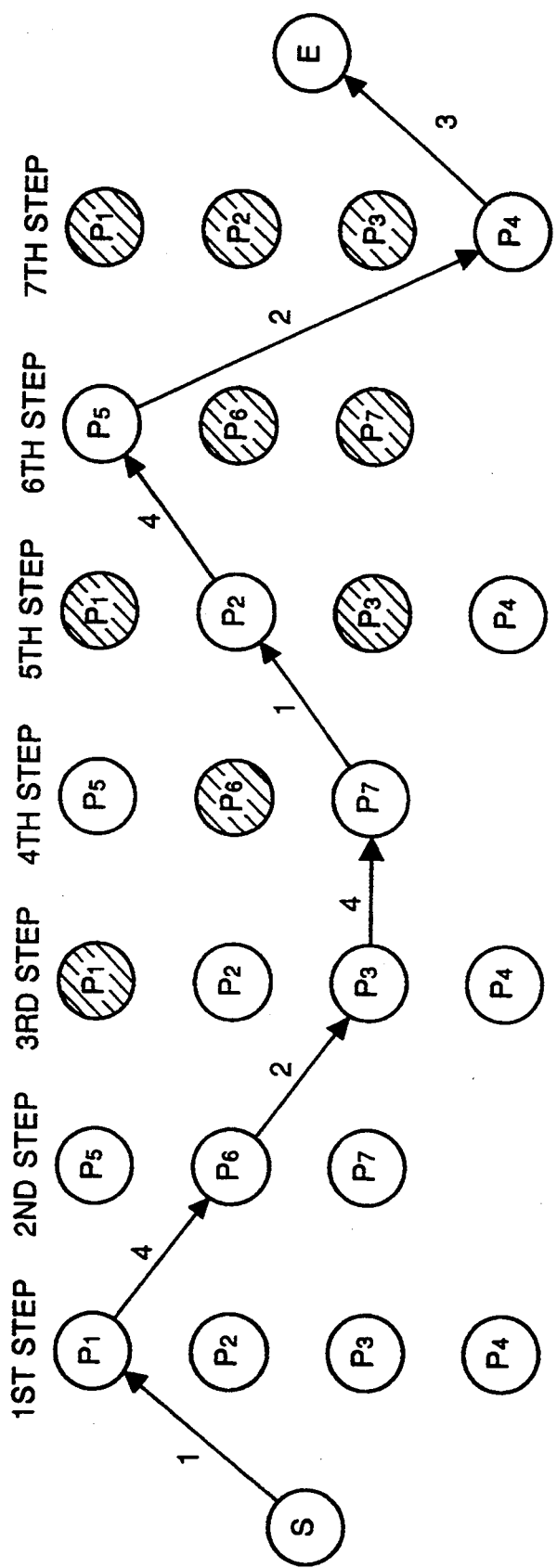
FIG. 24 is a diagram for illustrating an example of the mounting sequence which is determined by the conventional one-point searching method.

To simplify the explanation a model in which only two of the heads mount the parts on the circuit board is described. This model is useful not only to simplify the explanation, but also to clarify the effects of the "mn-point searching method". FIG. 24 illustrates the mechanism of the mounting sequence determination when seven parts are mounted by two heads in the conventional one-point searching method. The "mn-point searching method" of the present invention will be later described along FIG. 25.

Figure 23:
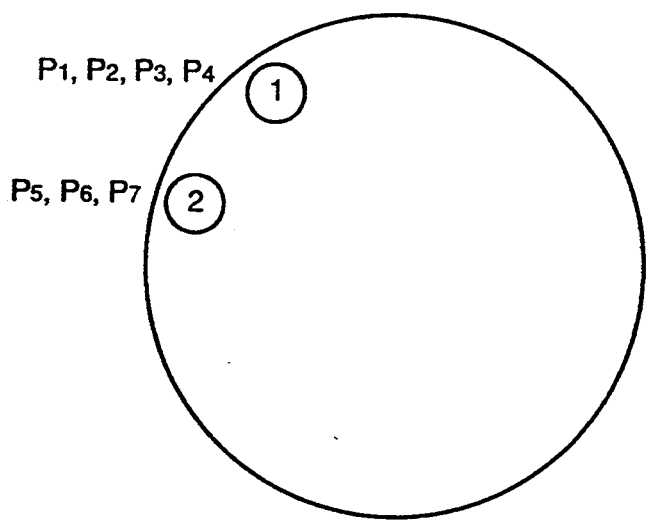
FIG. 23 is a diagram illustrating an example of the relation between the head and the corresponding part.

As shown in FIG. 23, it is determined by the head arrangement table HA such that the head "1" handles only four parts, P$_1$, P$_2$, P$_3$, and P$_4$, and the head "2" handles three parts P$_5$, P$_6$, and P$_7$.

The conventional "one-point searching method" is now described accompanying with FIG. 24.

In the first step, the part which is inserted by the head (H=1) is one of the parts P$_1$~P$_4$. As shown in FIG. 16, selecting the part P$_1$ in the first step is the most inexpensive (effective) sequence. Therefore, the part P$_1$ is selected as FIG. 24. In the second step, from head H=2, either one of the parts P$_5$ and P$_6$ is selected because they have the same tact time. In the second step (as shown in FIG. 16), selecting the part P$_6$ (or P$_5$) after the part P$_1$ is the most cost effective sequence. Therefore, as shown in FIG. 24, the part P$_6$ is selected in the second step. In the third step, since the part P$_1$ has been already selected in the first step, the next part to be selected here is one of the remaining parts P$_2$, P$_3$, and P$_4$. In the third step, as shown in FIG. 16, selecting the part P$_3$ after the part P$_6$ is the most cost effective sequence. Therefore, the part P$_3$ is selected in the third step as shown in FIG. 24. In the fourth step, the part which is inserted by the head H=2 is either the part P$_5$ or the part P$_7$. As shown in FIG. 16, selecting the part P$_7$ after the part P$_3$ in the fourth step is the most cost effective sequence. Therefore, the part P$_7$ is selected as shown in FIG. 24. In the fifth step, the part which is inserted by the head H=1 is either the part P$_2$ or the part P$_4$. In this way, in the process from the first step through the seventh step, the mounting sequence is determined so that the parts are mounted in the order of S→P$_1$→P$_6$→P$_3$→P$_7$→P$_2$→P$_5$→P$_4$→E. The tact time Tij in the parts mounting process (FIG. 16) is $1 \to 4 \to 2 \to 4 \to 1 \to 4 \to 2 \to 3 \to 3$. That is, in the conventional "one-point searching method", the total tact time to mount the parts on the board is "24".

Thus, in the "one-point searching method" the part to be mounted in a step is first determined (i.e. the part $P_i$ in the first step in FIG. 24), and then, the only parts capable of being mounted in the next step (i.e. the parts $P_5 \sim P_7$ in FIG. 24) are considered. However, it is not always true that the part in which the tact time is the minimum is among the parts capable of being mounted in the next step. Since even if selecting the part $P_6$ for the second step realizes the minimum tact time for that step, it is not assured that the choices ($P_6 \to P_2$, $P_6 \to P_3$, and $P_6 \to P_4$) in the third step will be the best choices.

Figure 25:
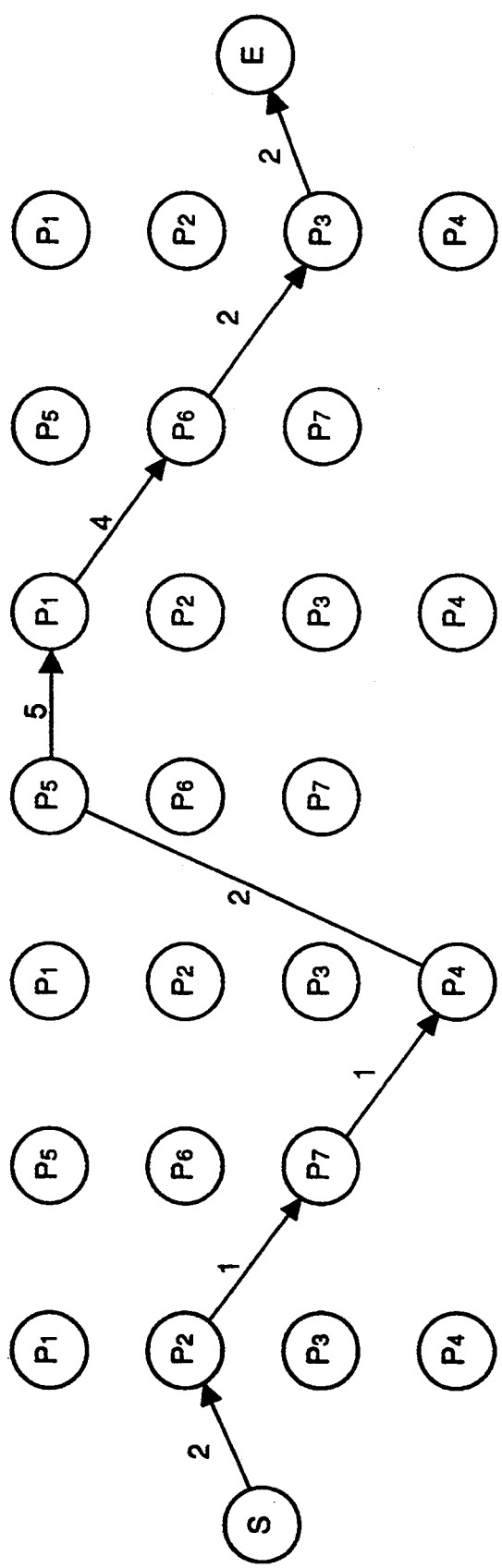
FIG. 25 is a diagram for illustrating an example of the mounting sequence which is determined by the mn-point searching method.
Figure 26:
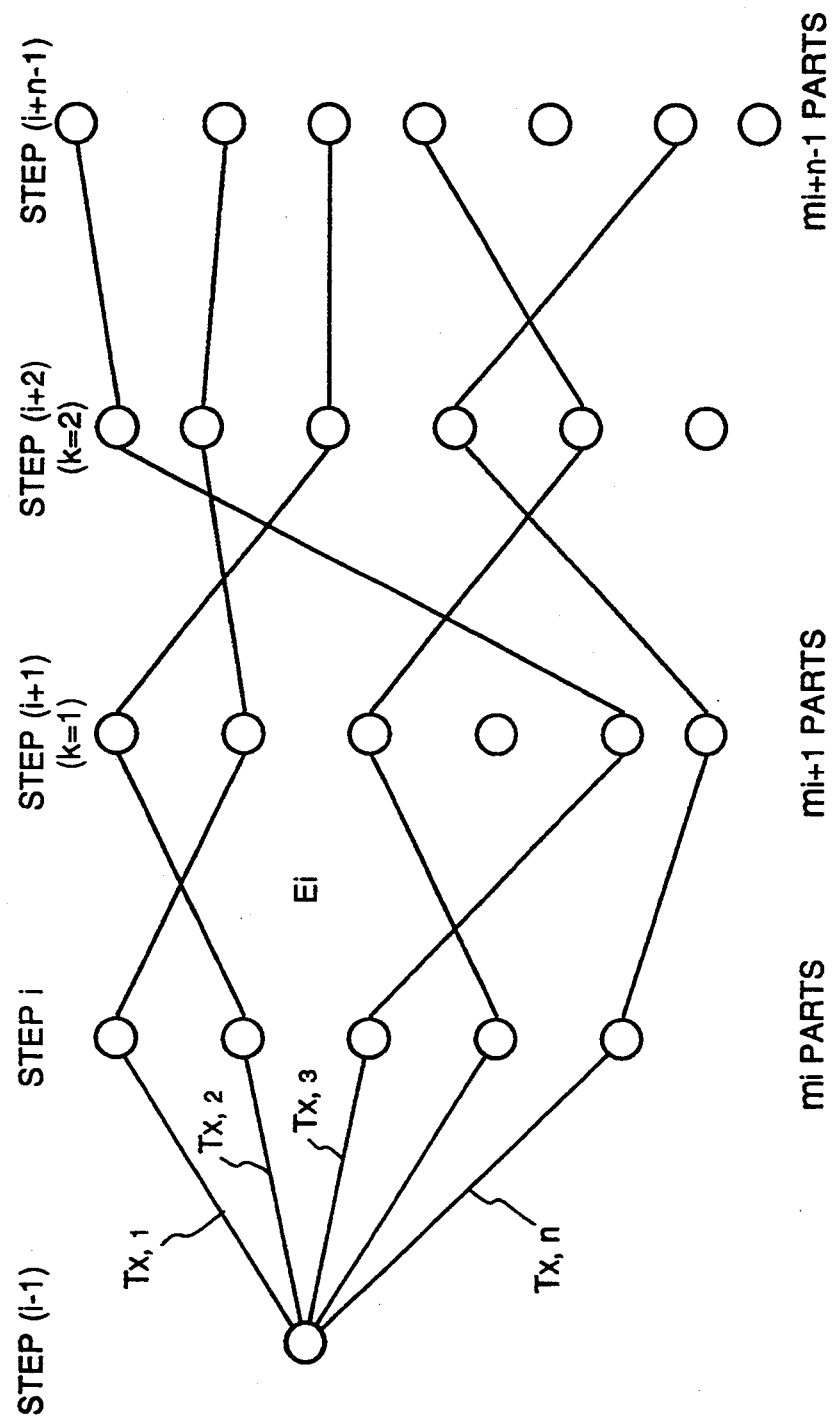
FIG. 26 is a diagram for explaining the principle of the mn-point searching method.

As shown in FIG. 26, the "mn-point searching method" is to determine the minimum tact time considering the coming n steps. FIG. 25 illustrates the result in the case where the seven parts $P_1 \sim P_7$ the mounting costs of which are shown in FIG. 16 are mounted by the two heads in accordance with the mn-point searching method. In the mn-point searching method, to simplify the description, n, the number of searches to be performed for the minimum tact time, is set to 3. The "n=3" includes step $(i+3-1)$ to determine the part to be mounted in step i. Furthermore, when the parts are sequentially determined, there is the case that the number of the rest of steps is smaller than "n". In such case, the number of the steps to be referred is less than "n".

In FIG. 26, the method to determine the mounting sequence of the part in step i is described. In the case where the mounting sequence of the part in step i is to be determined, the part to be mounted in step $(i-1)$ should have been already determined. The mn-point searching method considers step $(i+n-1)$. In step i, the number of possible parts $P_{i,j}$ ($j=1 \sim m_i$) that can be mounted is $m_i$ parts. In step $(i+1)$, the number of possible parts $P_{i+1,j}$ ($j=1 \sim m_{i+1}$) that can be mounted is $m_{i+1}$ parts. In step $(i+n-1)$, the number of possible parts $P_{i+n-1,j}$ ($j=1 \sim m_{i+n-1}$) that can be mounted is $m_{i+n-1}$ parts.

In the mn-point searching method, in order to determine which part, one of $m_i$, is best for step i, each of the tact times $T_{x,1}, T_{x,2}, \ldots, T_{x,mi}$ from the part x in step $(i-1)$ to each of the $m_i$ parts in step i is respectively calculated.

Then, for example, for part $m_1$ in step i, the minimum tact time for each part in step $(i+1)$ is determined, and the piece $m_{i+1}$ with the minimum tact time is chosen. Then from that piece chosen in step $(i+1)$, $m_{i+1}$, the minimum time for the parts in step $(i+2)$ is determined, and an appropriate part $m_{i+2}$ is chosen. Then from that, the minimum tact time for a part in step $(i+3)$ is chosen, etc. This continues through to step $(i+n-1)$. Then the tact time $T_{x,1}$, and the sum of the tact times $\Sigma_1$, from the first part $m_1$ in step i, continuing along the path of minimum tact times as chosen above, are added. The sum of the two tact times, $T_{x,1}$ and $\Sigma_1$, are assigned the evaluation value $E_1$.

Then for part $m_2$ in step i, the minimum tact time for each part in step $(i+1)$ is determined, and the piece $m_{i+1}$ with the minimum tact time is chosen. Then from that piece chosen in step $(i+1)$, $m_{i+1}$, the minimum time for the parts in step $(i+2)$ is determined, and an appropriate part $m_{i+2}$ is chosen. Then from that, the minimum tact time for a part in step $(i+3)$ is chosen, etc. This continues through to step $(i+n-1)$. Then the tact time $T_{x,2}$, and the sum of the tact times $\Sigma_2$, from the first part $m_2$ in step i, continuing along the path of minimum tact times as chosen above, are added. The sum of the two tact times, $T_{x,2}$ and $\Sigma_2$, are assigned the evaluation value $E^2$.

The above described loop is repeated, such that, for part mi in step i, the minimum tact time for each part in step $(i+1)$ is determined, and the piece $m_{i+1}$ with the minimum tact time is chosen. Then from that piece chosen in step $(i+1)$, $m_{i+1}$, the minimum time for the parts in step $(i+2)$ is determined, and an appropriate part $m_{i+2}$ is chosen. Then from that, the minimum tact time for a part in step $(i+3)$ is chosen, etc. This continues through to step $(i+n-1)$. Then the tact time $T_{x,n}$, and the sum of the tact times $\Sigma_i$, from the first part $m_i$ in step i to $m_{i+1}$ in step $(i+1)$, to part $mi+2$ in step $(i+2)$ etc., all the way through to step$(i+n-1)$, continuing along the path of minimum tact times as chosen above, are added. The sum of the two tact times, $T_{x,mi}$ and $\Sigma_{mi}$, are assigned the evaluation value $E_{mi}$.

Finally, the part which can provide the minimum value among the evaluation value $E_1, E_2, \ldots, E_{mi}$ is determined as the most appropriate part in step i.

In this way, the part in step i is determined. The part to be mounted in step $(i+1)$ can be determined in a similar way to that of step i.

When the aforementioned processing is repeated, the parts to be mounted from the first step to the last step are determined and the mounting sequence enables to provide the mounting sequence in which the tact time is the minimum.

Detailed Description of the Mn-point Searching Method

The detailed description of controlling process of the mn-point searching method is described along with FIG. 22.

In step S402 of FIG. 22, the searching depth n which has been inputted by an operator is stored. That is, according to the present system, the operator can determine an appropriate searching depth n. If n is a considerably large number, the accuracy of the solution of the mounting sequence which provides the minimum tact time is increased. However, in practice, n does not have to be set to the number which is larger than the number of the all steps and the accuracy is not increased much even if the n is set at large. On the contrary, there may be the drawback that the operation time becomes considerably long. The system according to the present embodiment can shorten this operation time by freely setting the searching depth n.

In step S404, the variable i is initialized to "1". This variable designates step number which determines the mounting sequence of a step. In step S406, the variable k is initialized to "1". This variable k stores the offset value from step i to step which is being searched in the case where the search to step $(i+n-1)$ is performed to determine the part in step i. In step 408, the variable j is initialized to "1". As shown in FIG. 26, in the case where there are $m_i$ parts which are capable of being mounted in step i, the total of $m_i$ routes can be set. Searching the route of those $m_i$ routes which can provide the minimum tact time corresponds to determining the part to be mounted in step i. The variable j is one to designate one of the $m_i$ routes.

In step S410, the tact time $T_{x,j}$ is calculated. The tact time $T_{x,j}$ is the time required for mounting the j-th part in step i after mounting the part which has been determined in the one step prior to step i (that is, step $(i-1)$). If i=1, step $(i-1)$ is a start (S). In the example of FIGS. 23 and 24, it is $T_{o,1}=1$ as indicated in the matrix of FIG. 16.

In step S412, the variable $p=i+k$ is calculated. This variable p indicates step number on the search at that time. In step S414, the tact times $T_{p-1,h,1}, T_{p-1,h,2}, \ldots, T_{p-1,h,mp}$ are respectively calculated in the case where each of the first, the second, . . . , the $m_p$-th part is mounted after the h-th part is mounted in the one step prior to step p, which is step (p−1) (if k=1, it is equal to step i). The tact time $T_{p-l,h,1}$ is the time period from when the h-th part in step (p−1) is mounted to when the first part in the p step is mounted. The tact time $T_{p-1, h, 2}$ is the time period from when the h-th part in step (p−1) is mounted to when the second part in step p is mounted Furthermore, the tact time $T_{p-1,h,mp}$ is the time period from when the h-th part in step (p−1) is mounted to when the $m_p$-th part in step p is mounted The h-th part in step (p−1) means the candidate part which should be mounted in the part in step (p−1). In step S415, the routes corresponding to the parts which have already been determined or provisionally determined in the steps from the first step to step (p−1) are removed from $T_{p-1,h,1}, T_{p-1,h,2}, \ldots, T_{p-1,h,mp}$. In seep 416, the minimum value $T_{MIN}$ is found among $T_{p-1,h,1}, T_{p-1,h,2}, \ldots, T_{p-1,h,mp}$ and is stored. In step S417, since the part corresponding to the minimum value $T_{MIN}$ is the one which can provide the minimum tact time between step (p−1) and step p, the variable h is renewed according to the relative position in step p corresponding to the minimum value $T_{MIN,p}$. That is, the starting point to search the route which can provide the minimum tact time between step p and step (p+1) is the h-th part. More particularly, in FIG. 26, if k=1, p=i+1. The starting point in step (p−1) is the first part, h=1.

In this way, the shortest route from the h-th part in step p to step (p+1) is determined and stored.

In step S418, the offset value k for the variable p indicating step which is an object for search is increased only "1". In step S420, whether the route search to the depth n is completed is discriminated. If it is discriminated that the search has been completed, in the example in FIG. 26, the route which starts with the second part (j=2) in step i is as follows:

1st step→(i+1)th→(i+2)th→. . .→(i+n−1)

2nd step→1st step→3rd step→. . .→3rd step

In this way, the route to step (i+n−1) from the j-th part in step i which is an object step to be determined is obtained. In step S422, the evaluation value $E_j$ of the all tact times on the route which starts with the j-th pare is calculated as follows:

$$E_j = \sum_{r=i}^{r=i+n-1} T_{MINr}$$

The addition is performed in the range of r=i ~r=i+n−1. In step S424, whether or not the evaluation value $E_j$ is calculated for all $m_i$ parts in the i-th step which is an object step to be determined is discriminated.

If the discrimination in step S424 is YES, the evaluation values of $E_1 \sim E_{mi}$ should have been calculated. Then, in step S428, the minimum evaluation value $E_j$ is found. In step 430, the part number j which gives the minimum evaluation value is stored in x as a new value of the variable x.

Thus, the part to be mounted in step i has been determined. The process from steps S406–S430 are repeated until when it is discriminated that the process have been performed on the all parts which are used for the board.

In this way, the mounting sequence to all parts which are used for the board is determined.

As described above, FIG. 26 illustrates the mounting sequence which is determined by the mn-point searching method. It is clear that the mounting sequence of the mn-point searching method provides the shorter tact time than that of the one-point searching method.

Calculation of Processing Time

It takes considerable amount of time for the parts mounting sequence determination even in the aforementioned mn-point searching method as well as the conventional one-point searching method and the whole-points searching method. As a result, the operator must wait in front of the apparatus for a long time until when the sequence has been determined because the time required for the parts mounting sequence determination cannot be estimated. The system of FIG. 1 has the function which estimates the time required for the parts mounting sequence determination and this function is useful particularly to the operator.

Figure 29:
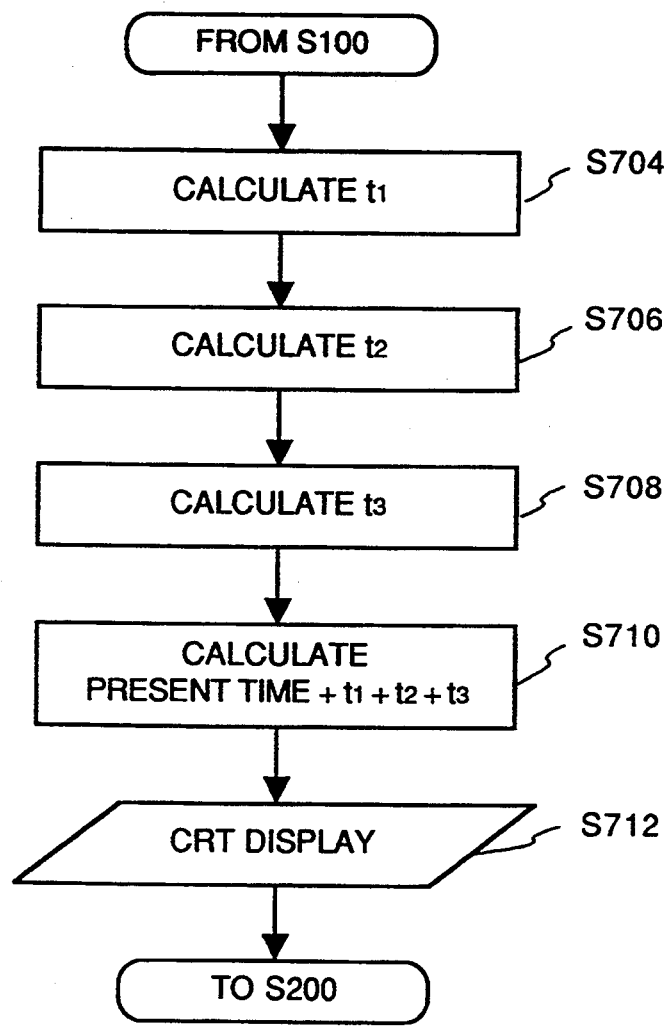
FIG. 29 is a flowchart indicating the controlling process for estimating the time for the mounting time determination processing.

The controlling process of FIG. 29 is executed in steps S100 and S200 in parallel. First, in step S704, time $t_1$ required for the head arrangement determination processing is calculated. In step S706, time $t_2$ required for the cassette arrangement determination processing is calculated. In step S708, time $t_3$ required for the mounting sequence determination processing is calculated. In step S710, the total calculated time $(t_1+t_2+t_3)$ is added to the present time and the estimated processing completion time is calculated. In step S712, the expected time is displayed.

In the example of $t_3$, the time required for operation is explained. The required time is calculated referring to the following:

(a) Type of the CPU used
(b) Kind of the algorithm processing
(c) Number of the parts to be mounted The controller 500 stores the execution speed of the CPU in advance. The controller 500 stores the standard processing time of the representative parts of each processing algorithm. In this way, the estimated time can be obtained.

<Effects of Embodiment>

Effects by the Mounting Sequence Determined by Using the Table

In the embodiment above, the data PT on the arrangement of the parts to be mounted on the print board, the data CP indicating the correspondence of the cassette number in the feeder and the cassette containing the part, and the data HT indicating the correspondence of each head capable of being held by the turret table mounter and the head capable of holing the part are inputted. First, the cassette arrangement table CA is determined by the table CP and the table PT. Then, the head arrangement HA table is determined by the table HP and the table PT. The sequence of the table CA determination and the table HA determination can be reversed. The mounting sequence is determined on the basis of the table CA, the table HA, and the table PT. That is, in the case where the circuit board is changed, as long as the heads can hold the parts needed for mounting or the feeder 100 accommodates the needed parts, neither of the head arrangement nor the head change are necessary, but the most appropriate mounting sequence can be determined for the new board.

Effects of the Mn-Point Searching Method

The mn-point searching method is compared with the conventional whole-point searching method or the one-point searching method. In the whole-point searching method, the combination of each part in the all steps from the first step to the last step provides the mounting sequence If the number of all steps is "a", in the searching depth n of the mn-point searching method, the searching sample number is considerably reduced because of $n < a$.

Furthermore, in the embodiment above, the route between step $(i-1)$ and step i is well considered, however, on the steps after step i, only the route which can provide the minimum tact time is selected in each route searching. Therefore, the accuracy is little decreased in comparison with the whole-point searching method, however, the time required for the mounting sequence determination is shortened since the number of route (part) sample is reduced.

As described above (in the comparison with FIG. 23 and FIG. 24), since the searching depth of the mn-point searching method becomes deeper than that of the one-point searching method, the appropriate accurate solution can be obtained in a shorter mounting time. In the mn-point searching method, the perfect resolution cannot be obtained resulting in the slight accuracy deterioration. However, this drawback is enough compensated by the considerable amount of the time reduction in the operation.

Furthermore, since the desirable searching depth n can be set, an accurate enough mounting sequence be obtained.

Effects of Estimated Operation Time

Since the processing time for the mounting time determination is displayed in advance, the operator do not have to wait in front of the apparatus and can spend that time effectively.

<Application>

Various changes and modifications may be made in the present invention without departing from the spirit and scope thereof.

Later Head Arrangement Change

As shown in FIG. 19, in the embodiment above, first of all, the data PT, data CP, data HP are inputted (step S100), and the head arrangement is determined (step S200), and then, the cassette arrangement is determined (step S300).

However, in the case where an objective board has been changed, it is desirable that head arrangement can be changed later. This application can be utilized in the case where the mounting sequence for other board is determined and its head arrangement is changed later.

Figure 27:
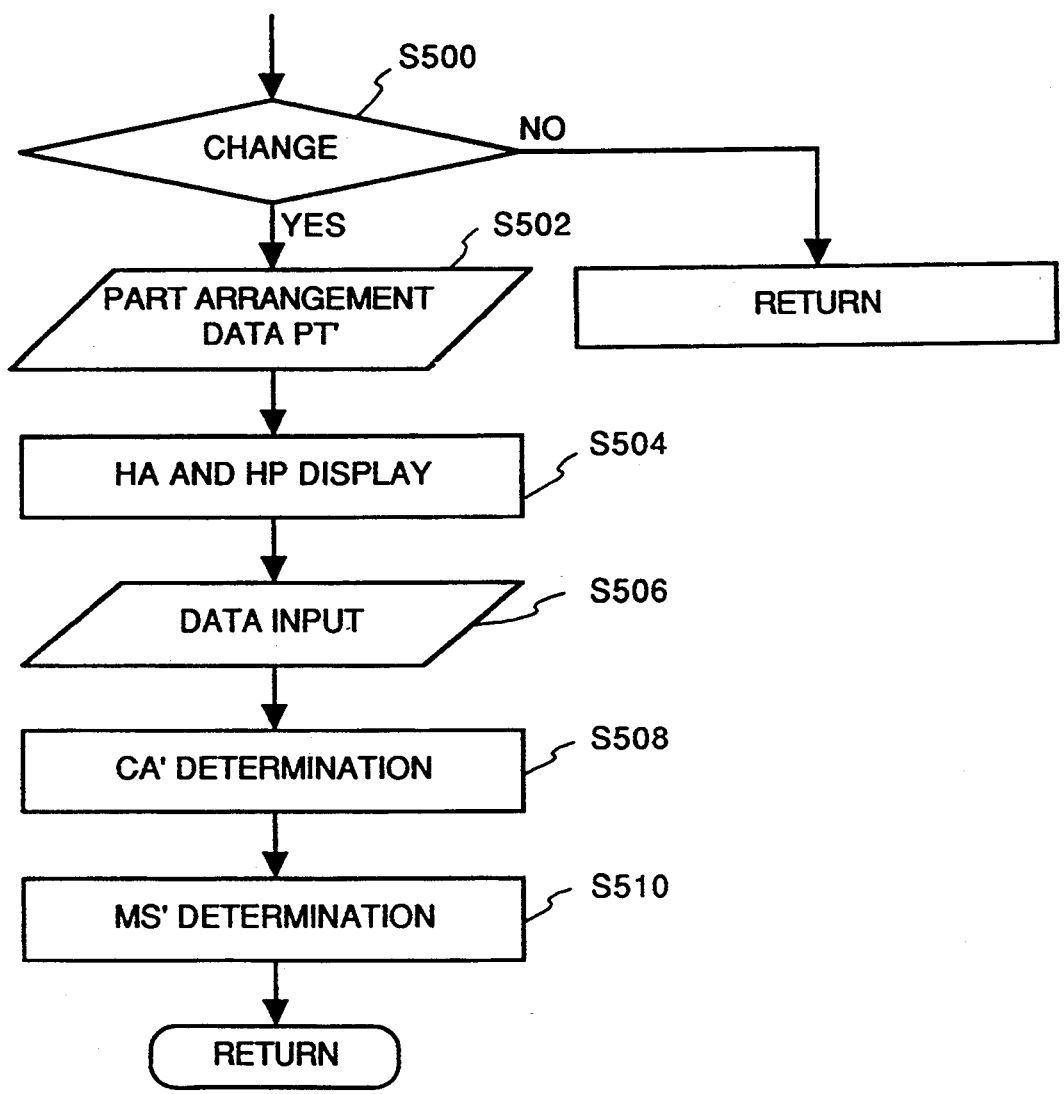
FIG. 27 is a flowchart indicating the part of the controlling process in another example.

Then, the controlling process shown in FIG. 27 is suggested instead of that in FIG. 19. First, the operator informs the change of the board by depressing the switch button (not shown) to the system. The system recognizes that board change in step S500. In step S502, the operator is urged to input the new part arrangement data PT'. In step S504, the head-part correspondence data HP which has been inputted in step S100 and the head arrangement table HA before the board change are displayed for the operator. In step S506, the operator is urged to input the head arrangement to be changed. In step S508, the new cassette arrangement table CA' is formed based on the inputted new data PT' according to the aforementioned rules. In step S510, the new mounting sequence MS' is generated based on the newly formed head arrangement table HA' and the cassette arrangement table CA'.

In this application, even if the board needs to be changed, the complicated arrangement can be eliminated.

Later Cassette Arrangement Change

This application is utilized in the case where a cassette arrangement is changed later when the mounting order for another board is determined.

Figure 28:
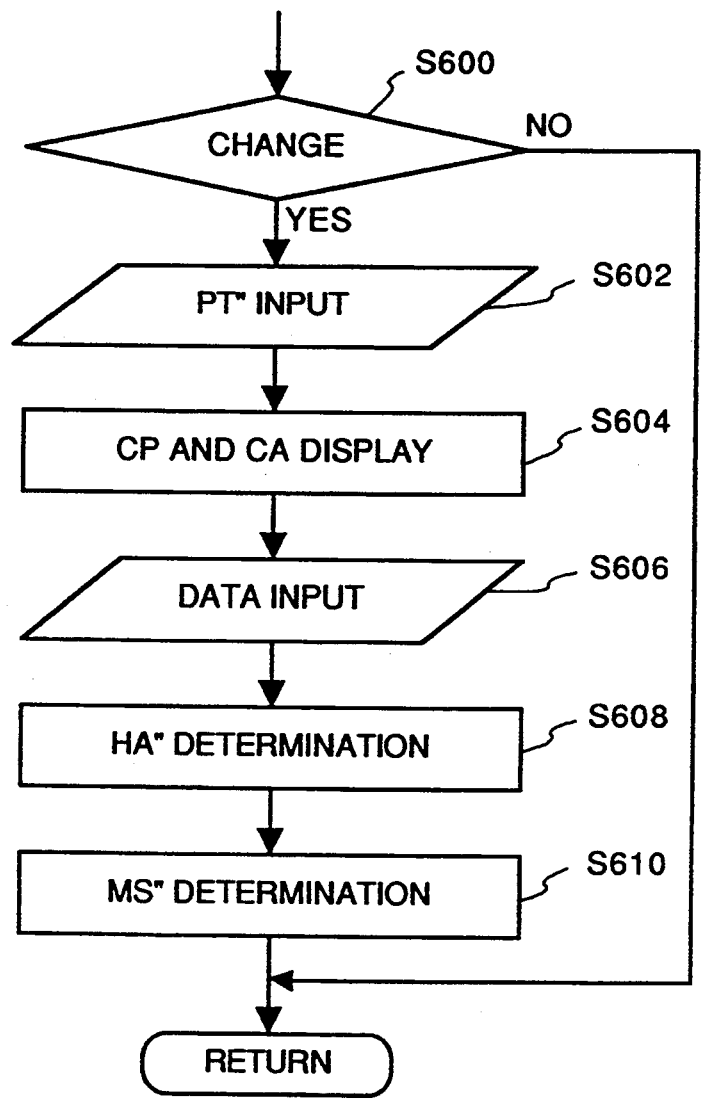
FIG. 28 is a flowchart indicating the part of the controlling process in another example.

The controlling process shown in FIG. 28 is suggested instead of that in FIG. 19. First, the operator informs the change of the board by depressing the change button (not shown) to the system. The system recognizes the board change in step S600. In step S602, the operator is urged to input the new part arrangement data PT'. In step S604, the cassette-part correspondence data CP which has been inputted in step S100 and the cassette arrangement table CA are displayed for the operator. In step S606, the operator is urged to input the cassette arrangement to be changed. In step S608, the new head arrangement table HA" is formed based on the newly inputted part arrangement data PT" according to the aforementioned rules. In step S610, the new mounting sequence MS" is generated based on the newly formed head arrangement table HA" and the cassette arrangement table CA".

In this application, even if the board needs to be changed, the complicated arrangement can be eliminated.

Figure 30:
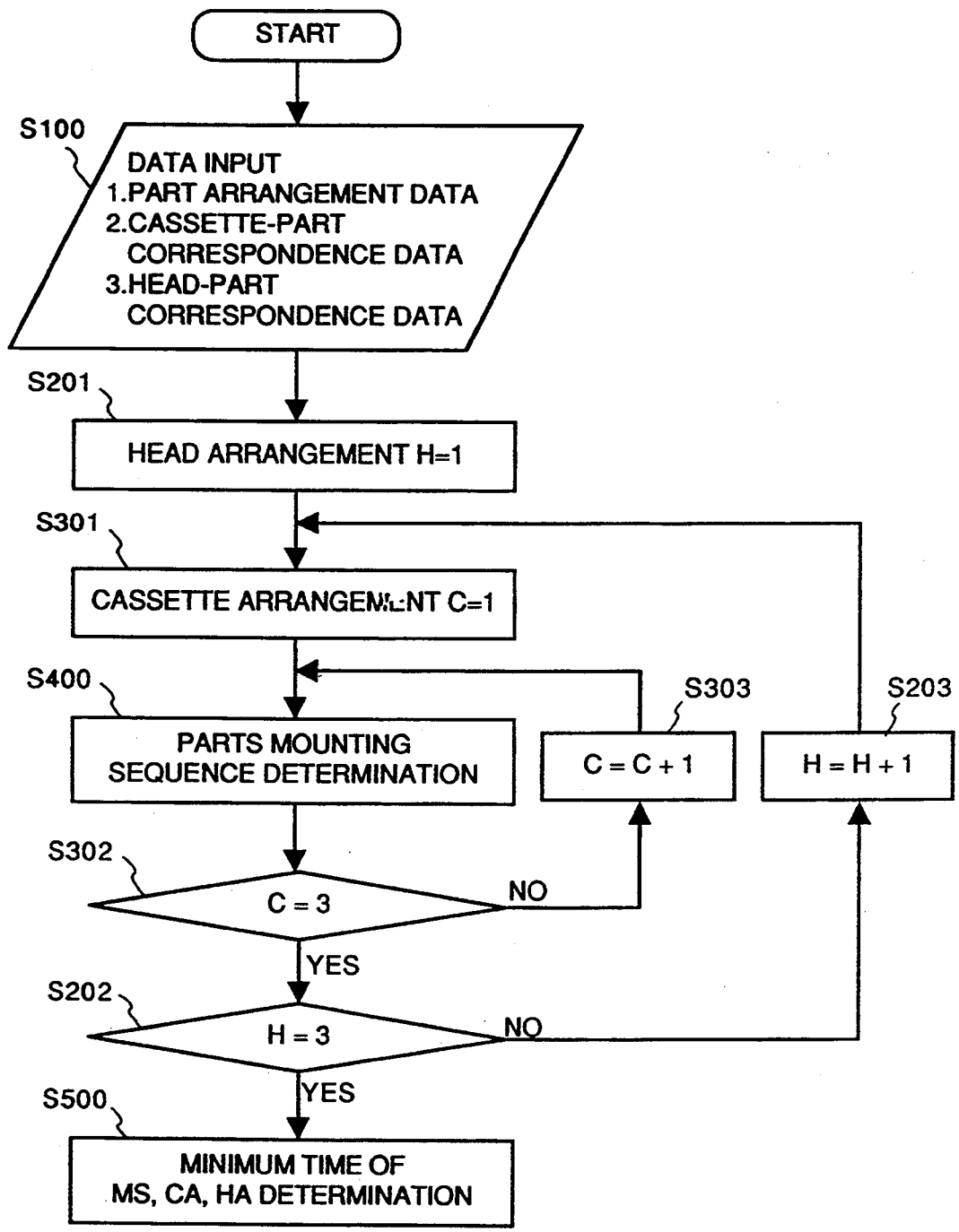
FIG. 30 is a flowchart indicating the controlling process of a modification to the embodiment.

Furthermore, in the embodiment of FIG. 19, the parts mounting sequence is determined in a manner such that a head arrangement and cassette arrangement are fixed to one of the rules H-1~H-3 and one of the rules C-1~C-3 respectively. However, the most suitable sequence can be selected among the mounting sequences which are obtained from the combinations of the rules C-1~C-3 and H-1~H-3. FIG. 30 is a flowchart illustrating this operation. The "H" and "C" are counters. When H=1, the rule H-1 is selected, when H=2, the rule H-2 is selected, and when H=3, the rule H-3 is selected. Similarly, when C=1, the rule C-1 is selected, when C=2, the rule C-2 is selected, and when C=3, the rule C-3 is selected. In FIG. 30, the process in steps S100, S400, and S500 are same as those in FIG. 19. In steps S201 and S301, the head arrangement and cassette arrangement are set to the rules H-1 and C-1. Then, in steps S203 and S303, they are set to the rules H-2, H-3, C-2, and C-3 are set.

Thus, an effective mounting sequence can be determined in a manner such the parts mounting sequence is determined on the plurality of combinations of the head arrangement and cassette arrangement.

As many apparently widely different embodiments of the present invention can be made without departing from the spirit and scope thereof, it is to be understood that the invention is not limited to the specific embodiments thereof except as defined in the appended claims.

What is claimed is:

1. A parts mounting sequence determination method which determines mounting sequence of m parts so that the m parts are sequentially moved to a mounting position, in order to be mounted on a board, by a part mounter, comprising the steps of:
   (a) determining and storing into a memory a first tact time required for sequentially mounting a pair of parts selected from among the m parts, each tact time being defined as the time required for driving the part mounter from when one pair of parts is at the mounting position to when the another part of the pair of parts is moved to the mounting position;

(b) calculating mi number of second tact time for mi number of possible paths to each of the mi (mi<m) parts from among the parts, the mi parts to be mounted in the i-th sequence step, with each possible route path being a path starting from each of the mi parts to a part assignable in a sequence of n steps from the i-the sequence step, and the second tact time being defined as a time period required for driving the part mounter along through this possible route;

(c) determining a part which provides a minimum tact time from the mi number of second tact time for the i-th sequence step calculated in step (b); and (d) determining each part to be mounted in every sequence step by the mounter by repeating steps (b) through (c) for each sequence step after the (i+1)-th sequence step.

2. A parts mounting sequence determination method according to claim 1, wherein the part mounter comprises a turret mounting unit having a rotary turret with a plurality of part mounting heads, the turret being capable of stopping at a pick-up position for picking-up a part and at the mounting position for inserting a part into the board; and a part feeding unit which is synchronized with the turret, the part feeding unit feeding a part so that the turret mounting unit picks-up the fed part at the pick-up position;

wherein the first tact time is stored so as to further include the time period required for driving the part feeding unit to feed one of a pair of parts to the turret when the mounting unit is at the mounting position.

3. A parts mounting sequence determination method according to claim 1, wherein the part mounter comprises;

a turret mounting unit having a rotary turret with a plurality of part mounting heads, the turret being capable of stopping at the mounting position for inserting a part into the board; and a board positioning unit which is synchronized with the turret, the board positioning unit moving the board so that a location at which a part is to be inserted on the board coincides with the mounting position of the turret;

wherein the first tact time is stored so as to further include a time period required for moving the board by the positioning unit.

4. A parts mounting sequence determination method according to claim 1, wherein step (b) further comprises the steps of:

(b-1): selecting a part among the mi parts capable of being allotted in the i-th sequence step;

(b-2): determining a tact time from a part determined in the previous (i−1)-th sequence step which has been determined and the part which was selected in step (b-1) on the basis of the first tact time stored in the memory;

(b-3): calculating tact time from the part selected in step (b-1) to every part of parts assignable for the (i+1)-th sequence step, the calculation being made on the basis of the stored first tact time;

(b-4): determining a part for the (i+1)-th step which gives a minimum tact time from among the tact times calculated in step (b-3); and (b-5): further repeating the determination operation of step (b-4) from for the (i+1)-th sequence step to for the (i+n−1)-th sequence step, each calculation operation being made between a part determined in step (b-4) and parts assignable for the next sequence step;

(b-6): operating a sum of tact times calculated for from the (i−1)-th sequence step to the (i+n−1)-th sequence step, and determining the sum as a tact time of the part selected in step (b-1);

(b-7): repeating steps (b-1) to (b-6) for each part selected in step. (b-1) to obtain tact times for each respective part of the $m_i$ parts.

wherein step (c) determines a part which gives a minimum tact time from among the tact times determined in every repetition of step (b-6).

5. A parts mounting sequence determination method according to claim 1, wherein the part mounter comprises a turret mounting unit having a rotary turret with a plurality of part mounting heads, the turret being capable of stopping at a pick-up position for picking-up a part and at a mounting position for inserting a part into the board, the pick-up and mounting positions being 180° apart from each other.

6. A parts mounting sequence determination apparatus for a part mounting system including:

a part feeder having a plurality of cassettes, which feeds a part included in the cassettes;

a turret mounter having a plurality of heads, each head being capable of picking-up the part fed by the part feeder at a pick-up position and holding the part, said mounter being capable of rotating the plurality of heads to a mounting position, and the head being capable of mounting the held part onto a work board at the mounting position; and a positioner which positions the work board to be mounted with the part held by the head of the mounter on the work board;

said apparatus comprising:

first data input means for inputting data representing relations between parts to be mounted on the work board and part cassettes which contain said parts;

second data input means for inputting data representing relations between the parts to be mounted on the work board and the heads capable of holding those parts;

third data input means for inputting a mounting coordinate of each part to be mounted on the work board;

first rule storage means for storing a first rule which determines a cassette arrangement of the cassettes in the feeder;

cassette arrangement determination means for determining an arrangement by applying the first rule to data input by the first input means;

second rule storage means for storing a second rule which determines an arrangement of the heads in the mounter;

head arrangement determination means for determining a head arrangement by applying the second rule to data input by the second input means; and mounting sequence determination means for determining a mounting sequence by using the cassette arrangement which has been determined by the cassette arrangement determination means, the head arrangement which has been determined by the head arrangement determination means, and mounting the coordinate data input by the third input means.

7. A parts mounting sequence determination apparatus according to claim 6, wherein each cassette of the part feeder contains a plurality of respective parts, the part feeder is provided in such a manner that the cassettes are arranged to be capable of being changed in their positions, and the part feeder further includes means for moving the cassettes so that a cassette which contains a requested part is moved to the pick-up position, wherein the apparatus further comprises:
a fourth data input means for inputting data to indicate a position change of the cassettes; and
rule altering means for altering a content of the first rule in response to data input by the fourth input means, and
wherein the apparatus determines the mounting sequence by using the altered first rule.

8. A parts mounting sequence determination apparatus according to claim 6, wherein said apparatus further comprises:
a fifth data input means for inputting data to indicate a position change in head arrangement of the turret mounter; and
means for altering a content of the second rule in response to data input by the fifth data input means, and
wherein the apparatus determines the mounting sequence by using the altered second rule.

9. A parts mounting sequence determination apparatus according to claim 6, further comprising:
means for calculating the operation time required for parts mounting sequence determination; and
means for displaying said time calculated by the calculating means.

10. A part mounting apparatus comprising:
a plurality of cassettes, each containing parts to be mounted;
first conveying means for conveying one of the plurality of cassettes to a predetermined pick-up position;
a plurality of pick-up heads, each capable of picking up a part from a cassette conveyed to the pick-up position by the first conveying means, said plurality of pick-up heads being capable of rotating as a single unit, and each of said plurality of pick-up heads being provided corresponding to a kind of part;
second conveying means for conveying a board to a predetermined mounting position at which a part picked-up by one of said plurality of pick-up heads is mounted on the board;
input means for inputting first data representing an arrangement of parts to be mounted on the board, second data representing a correspondence relation of cassette and part, and third data representing a correspondence relation of head and part; and
control means for obtaining a plurality of head-arrangements of said plurality of pick-up heads and a plurality of cassette-arrangements of the plurality of cassettes, and determining a mounting sequence of parts on the basis of one of the plurality of head-arrangements and one of the plurality of cassette-arrangements, said mounting sequence providing a minimum tact time required for conveying the plurality of cassettes, rotating the plurality of pick-up heads, and conveying the board.

11. The apparatus according to claim 10, wherein the pick-up position is provided to be opposing to and located at the position 180 degrees from the mounting position.

12. A part mounting apparatus comprising:
a plurality of cassettes, each containing parts to be mounted;
first conveying means for conveying one of the plurality of cassettes to a predetermined pick-up position;
a plurality of pick-up heads, each capable of picking-up a part from a cassette conveyed to the pick-up position by the first conveying means, said plurality of pick-up heads being capable of rotating as single unit, and each of said plurality of pick-up heads being provided corresponding to a kind of part;
second conveying means for conveying a board to a predetermined mounting position at which a part picked-up by one of said plurality of pick-up heads is mounted on the board;
control means for selecting a first kind of part and a second kind of part so that a number m of said first kind of parts to be mounted on the board is equal to a number n of said second kind of parts to be mounted on the board, the number m being different from the number n by 1, or that the numbers m and n are the largest two in the unselected parts, and for determining a head arrangement of the plurality of pick-up heads so that two opposing heads pick-up the first kind of part and the second kind of part, respectively.

* * * * *